United States Patent
Damghanian et al.

(10) Patent No.: US 11,604,363 B2
(45) Date of Patent: Mar. 14, 2023

(54) IMAGE SENSOR COMPRISING A COLOR SPLITTER WITH TWO DIFFERENT REFRACTIVE INDEXES

(71) Applicant: InterDigital CE Patent Holdings, Paris (FR)

(72) Inventors: Mitra Damghanian, Cesson-Sévigné (FR); Oksana Shramkova, Cesson-Sévigné (FR); Valter Drazic, Betton (FR)

(73) Assignee: InterDigital CE Patent Holdings, Paris (FR)

( * ) Notice: Subject to any disclaimer, the term of this patent is extended or adjusted under 35 U.S.C. 154(b) by 0 days.

(21) Appl. No.: 16/980,326

(22) PCT Filed: Mar. 8, 2019

(86) PCT No.: PCT/EP2019/055905
§ 371 (c)(1),
(2) Date: Sep. 11, 2020

(87) PCT Pub. No.: WO2019/175062
PCT Pub. Date: Sep. 19, 2019

(65) Prior Publication Data
US 2021/0041709 A1   Feb. 11, 2021

(30) Foreign Application Priority Data
Mar. 13, 2018 (EP) .................... 18305265

(51) Int. Cl.
*G02B 27/10* (2006.01)
*G01J 3/50* (2006.01)
*G01J 3/51* (2006.01)

(52) U.S. Cl.
CPC .......... *G02B 27/1013* (2013.01); *G01J 3/50* (2013.01); *G01J 3/51* (2013.01)

(58) Field of Classification Search
CPC .......... G01J 3/50; G01J 3/51; G02B 27/1013; G02B 27/56; H01L 27/14621; H01L 27/14625
See application file for complete search history.

(56) References Cited

U.S. PATENT DOCUMENTS

| 3,718,383 A | 2/1973 | Moore |
| 6,099,146 A | 8/2000 | Imamura |

(Continued)

FOREIGN PATENT DOCUMENTS

| CN | 1606704 A | 4/2005 |
| CN | 1661478 A | 8/2005 |

(Continued)

OTHER PUBLICATIONS

International Preliminary Report on Patentability for PCT/EP2019/063802 dated Dec. 29, 2020, 8 pages.

(Continued)

*Primary Examiner* — Hina F Ayub
(74) *Attorney, Agent, or Firm* — Invention Mine LLC

(57) ABSTRACT

The disclosure relates to an image sensor comprising pixels for acquiring color information from incoming visible light, wherein said image sensor comprising at least two pixels being partially covered by a color splitter structure comprising a first part and a second part, each of said first and second parts being adjacent to a dielectric part, each of said dielectric part having a first refractive index $n_1$ (said first part having a second refractive index $n_2$, and said second part having a third refractive index $n_3$, wherein $n_1 < n_3 < n_2$, and wherein according to a cross section, the first part of said color splitter structure has a first width $W_1$, a height H and the second part of said color splitter structure has a second width $W_2$, and the same height H, and wherein said color splitter structure has a first, a second and a third edges at the interfaces between parts having different refractive indexes, (Continued)

(a)

(b)

(c)

(d)

Figure 1:
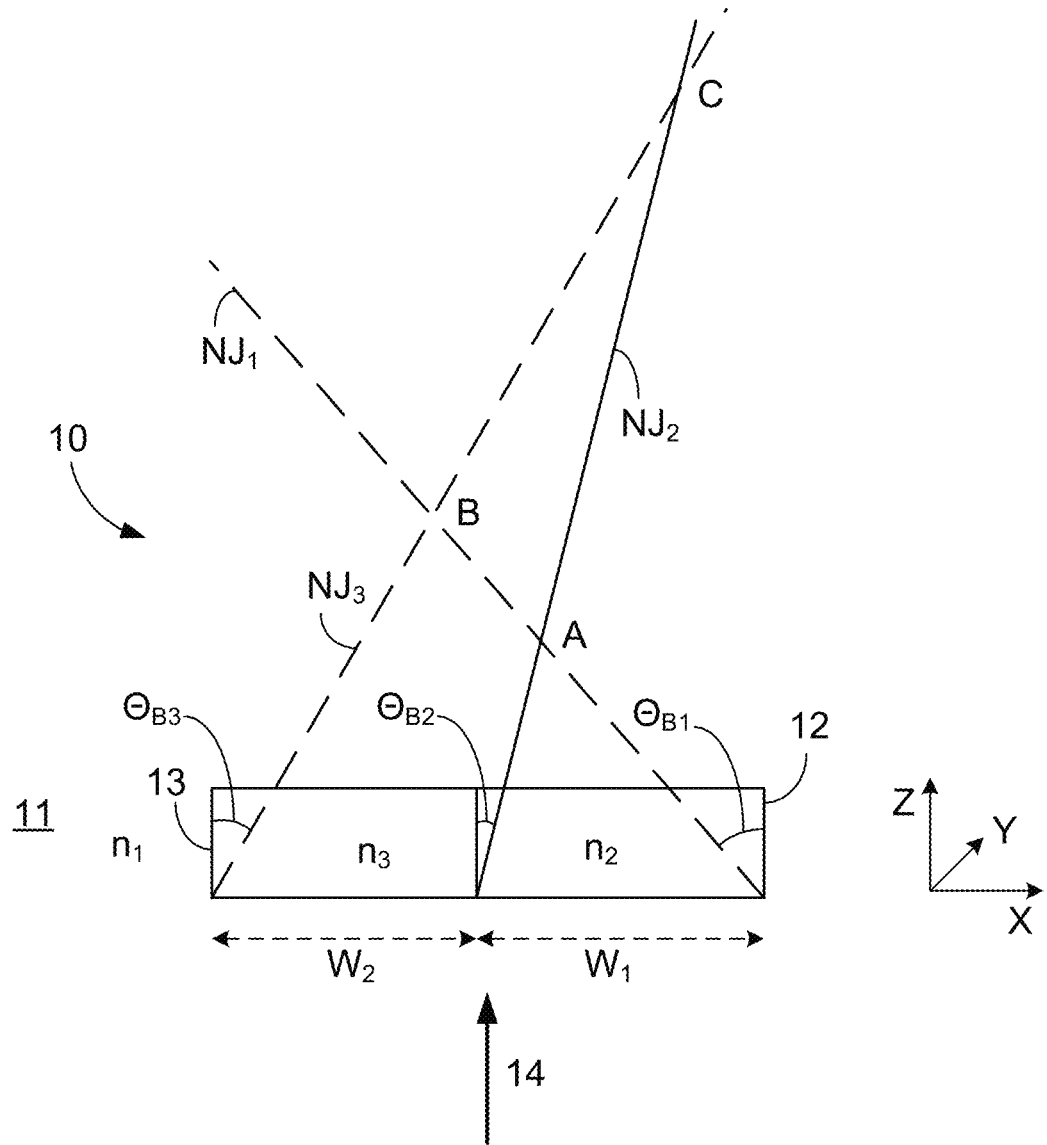
Figure 2:
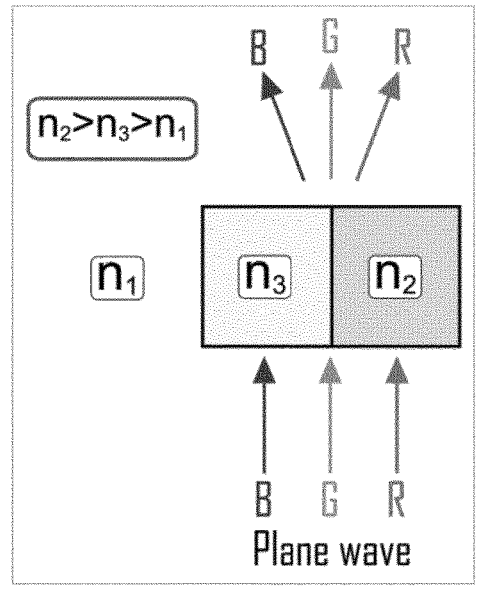
Figure 2:
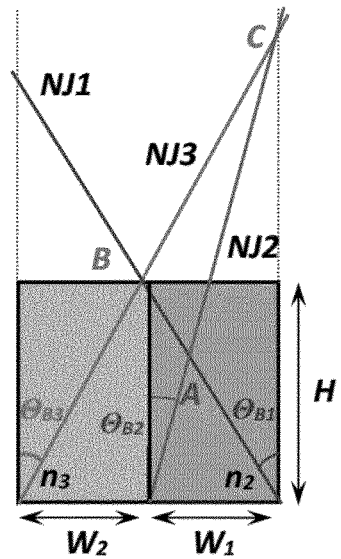
Figure 2:
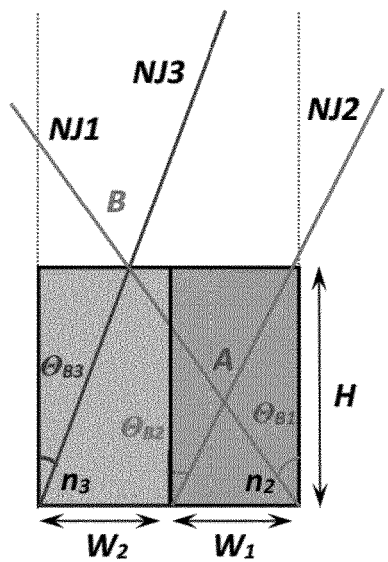
Figure 2:
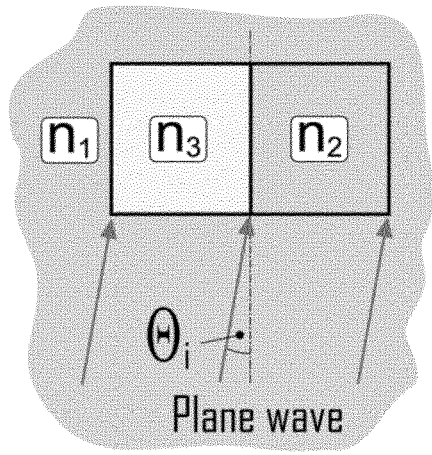

each edge generating beams or nanojets, and wherein said height H is close to a value Formul (I), where $\Theta_{B1}$ and $\Theta_{B3}$ are tan $\Theta_{B1}$ and are respectively radiation angles of a first and a third beams generated by said first and third edges, and wherein one of said at least two pixels records light associated with a first wavelength $\lambda_{-1}$ and the other of said at least two pixels records light having a spectrum in which no or few electromagnetic waves having a wavelength equal to $\lambda_{-1}$ are present, wherein said first wavelength $\lambda_{-1}$ being either high or small in a range of visible light.

17 Claims, 66 Drawing Sheets

(56) References Cited

U.S. PATENT DOCUMENTS

| | | | |
|---|---|---|---|
| 7,394,535 | B1 | 7/2008 | Chen |
| 8,885,997 | B2 | 11/2014 | Nguyen |
| 9,099,370 | B2 | 8/2015 | Nishiwaki |
| 9,140,602 | B2 | 9/2015 | Narasimhan |
| 9,383,582 | B2 | 7/2016 | Tang |
| 9,419,036 | B2 | 8/2016 | Saitou |
| 9,564,469 | B2 | 2/2017 | Kim |
| 9,766,467 | B2 | 9/2017 | Sohn |
| 9,891,436 | B2 | 2/2018 | Wall |
| 10,534,115 | B1 | 1/2020 | Calafiore |
| 10,866,360 | B2 | 12/2020 | Khorasaninejad |
| 11,204,452 | B2 | 12/2021 | Paniagua Dominguez |
| 2005/0002611 | A1 | 1/2005 | Levola |
| 2006/0124833 | A1 | 6/2006 | Toda |
| 2009/0190094 | A1 | 7/2009 | Watanabe |
| 2011/0235166 | A1 | 9/2011 | Zhu |
| 2013/0099343 | A1 | 4/2013 | Toshikiyo |
| 2013/0250421 | A1 | 9/2013 | Wakabayashi |
| 2013/0322810 | A1 | 12/2013 | Robbins |
| 2015/0063753 | A1 | 3/2015 | Evans |
| 2015/0286060 | A1* | 10/2015 | Roh ............. G02B 27/12 359/615 |
| 2015/0323800 | A1 | 11/2015 | Nam |
| 2015/0362641 | A1 | 12/2015 | Boyraz |
| 2016/0054172 | A1 | 2/2016 | Roh |
| 2016/0064172 | A1 | 3/2016 | Kirbawy |
| 2016/0070062 | A1 | 3/2016 | Lipson |
| 2016/0231568 | A1 | 8/2016 | Saarikko |
| 2017/0006278 | A1 | 1/2017 | Vandame |
| 2017/0012078 | A1 | 1/2017 | Han |
| 2017/0090206 | A1 | 3/2017 | Kim |
| 2017/0092668 | A1 | 3/2017 | Kim |
| 2017/0092676 | A1 | 3/2017 | Yun |
| 2017/0097510 | A1* | 4/2017 | Sohn ............. H01L 27/14625 |
| 2017/0098672 | A1 | 4/2017 | Yun |
| 2017/0179178 | A1* | 6/2017 | Park ............. H01L 27/14621 |
| 2017/0212348 | A1 | 7/2017 | Fu |
| 2017/0307886 | A1 | 10/2017 | Stenberg |
| 2017/0315346 | A1 | 11/2017 | Tervo |
| 2018/0113313 | A1 | 4/2018 | Tekolste |
| 2018/0231771 | A1 | 8/2018 | Schuck, III |
| 2019/0101700 | A1 | 4/2019 | Boriskin |
| 2019/0121239 | A1 | 4/2019 | Singh |
| 2021/0041709 | A1 | 2/2021 | Damghanian |

FOREIGN PATENT DOCUMENTS

| | | |
|---|---|---|
| CN | 106331445 A | 1/2017 |
| CN | 106772734 A | 5/2017 |
| CN | 106932845 A | 7/2017 |
| CN | 109073885 A | 12/2018 |
| EP | 1406098 A1 | 4/2004 |
| EP | 1542043 A1 | 6/2005 |
| EP | 2196729 | 6/2010 |
| EP | 2955753 | 12/2015 |
| EP | 3223062 A1 | 9/2017 |
| EP | 3223063 A1 | 9/2017 |
| EP | 3240046 A1 | 11/2017 |
| EP | 3312646 A1 | 4/2018 |
| EP | 3312660 A1 | 4/2018 |
| EP | 3312674 A1 | 4/2018 |
| EP | 3339938 A1 | 6/2018 |
| EP | 3385219 A1 | 10/2018 |
| EP | 3499278 | 6/2019 |
| EP | 3540479 A1 | 9/2019 |
| EP | 3540499 A1 | 9/2019 |
| EP | 3588150 | 1/2020 |
| EP | 3591700 A1 | 1/2020 |
| EP | 3671293 | 6/2020 |
| EP | 3671322 A1 | 6/2020 |
| GB | 2529003 | 2/2016 |
| WO | 03007032 A1 | 1/2003 |
| WO | 2003025635 A1 | 3/2003 |
| WO | 2007031991 A2 | 3/2007 |
| WO | 2009083977 A2 | 7/2009 |
| WO | 2014036537 A1 | 3/2014 |
| WO | 2014044912 | 3/2014 |
| WO | 2017116637 | 7/2017 |
| WO | 2017116637 A1 | 7/2017 |
| WO | 2017131983 | 8/2017 |
| WO | 2017162880 A1 | 9/2017 |
| WO | 2017162882 A1 | 9/2017 |
| WO | 2017180403 | 10/2017 |
| WO | 2017180403 A1 | 10/2017 |
| WO | 2018102582 | 6/2018 |
| WO | 2018102582 A1 | 6/2018 |
| WO | 2018102834 A2 | 6/2018 |
| WO | 2021053182 | 3/2021 |

OTHER PUBLICATIONS

Genevet, Patrice, et. al., "Recent Advances In Planar Optics: From Plasmonic To Dielectric Metasurfaces". Optica, vol. 4, No. 1, Jan. 2017, pp. 139-152.

Aieta, Francesco, et. al., "Multiwavelength Achromatic Metasurfaces By Dispersive Phase Compensation". Sciencexpress, 2015, (8 pages).

Khorasaninejad, Mohammadreza, et. al., "Achromatic Metasurface Lens At Telecommunication Wavelengths". Nano Letters, 2015, (5 pages).

Deng, Zi-Lan, et. al., "Wide-Angle And High-Effidency Achromatic Metasurfaces For Visible Light". Optical Express, vol. 24, No. 20 pp. 23118-23128 (12 pages).

Avayu, Ori, et. al., "Composite Functional Metasurfaces For Multispectral Achromatic Optics". Nature Communications, 2017, pp. 1-7 (7 pages).

Nishiwaki, Seiji, et. al., "Efficient Colour Splitters for High-Pixel-Density Image Sensors". Nature Photonics, vol. 7, Mar. 2013, pp. 240-246.

International Search Report and Written Opinion of the International Searching Authority for PCT/EP2019/085489, dated Jan. 30, 2020, 11 pages.

Yi, Jianjia, et. al., "Coherent Beam Control With An All-Dielectric Transformation Optics Based Lens". Scientific Reports, vol. 6, No. 1, Jan. 5, 2016, pp. 1-8.

Zhao, Yanhui, et. al., "Beam Bending Via Plasmonic Lenses". Optics Express, vol. 18, No. 22, Oct. 25, 2010, pp. 23458-23465.

Jun, Young Chul, et. al., "Optical Manipulation With Plasmonic Beam Shaping Antenna Structures". Advances in OptoElectronicsm, (2012).

Khorasaninejad, Mohammadreza, et. al., "Super-Dispersive Off-Axis Meta-Lenses For Compact High Resolution Spectroscopy". Nano Letters, vol. 16, No. 6, (2016), pp. 3732-3737.

Liu, Zhaowei, et. al., "Tuning The Focus Of A Plasmonic Lens By The Incident Angle". Applied Physics Letters, vol. 88, No. 17, (2006), pp. 171108-1-171108-2.

Chen, Yiguo, et. al., "Engineering The Phase Front Of Light With Phase-Change Material Based Planar Lenses". Scientific Reports vol. 5, No. 1, Mar. 2, 2015, pp. 1-7.

Kong, Soon-Cheol, et. al., "Photonic Nanojet-Enabled Optical Data Storage". Optical Society of America, Optics Express, vol. 16, No. 18, Sep. 1, 2008, pp. 13713-13719.

(56) References Cited

OTHER PUBLICATIONS

Pacheco-Peña, V., et. al., "Terajets Produced By Dielectric Cuboids". Applied Physics Letters 105, 084102, (2014), doi: 10.1063/1.4894243, 5 pages.
Pacheco-Peña, V., et. al., "Multifrequency Focusing And Wide Angular Scanning Of Terajets". Optical Society of America, Optics Letters, vol. 40, No. 2, (2015), 5 pages.
Itagi, A. V., et. al., , "Optics of Photonic Nanojets". Optical Society of America. J. Opt. Soc. Am. A , Vo.22, Dec. 2005 pp. 2847-2858 (12 pages).
Heifetz, Alexander, et. al., "Subdiffraction Optical Resolution Of A Gold Nanosphere Located Within The Nanojet Of A Mie-Resonant Dielectric Microsphere". Optical Express, vol. 15, No. 25, (2007), 17334-17342.
Devilez, Alexis, et. al., "Three-Dimensional Subwavelength Confinement Of Light With Dielectric Microspheres". Optics Express, vol. 17, No. 4, Feb. 16, 2009, pp. 2089-2094.
Shen, Yuecheng, et. al., "Ultralong Photonic Nanojet Formed By A Two-Layer Dielectric Microsphere". Optical Letters, Optical Society of America, vol. 39, No. 14, Jul. 15, 2014, 4120-4123.
Ruiz, César Méndez, et. al., "Detection Of Embedded Ultrasubwavelength—Thin Dielectric Features Using Elongated Photonic Nanojets". Optical Express, vol. 18, No. 16, Aug. 2, 2010, pp. 16805-16812.
Geints, Yuri E., et. al., "Photonic Nanojet Calculations In Layered Radially Inhomogeneous Micrometer-Sized Spherical Particles". Optical Society of America, vol. 28, No. 8, Aug. 2011, 1825-1830.
Gu, Guoqiang, et. al. "Super-Long Photonic Nanojet Generated from Liquid-Filled Hollow Microcylinder". Optical Society of America, Optical Letters, vol. 40, No. 4, Feb. 15, 2015, pp. 625-628.
Mao, Xiurun, et. al., "Tunable Photonic Nanojet Formed By Generalized Luneburg Lens". Optics Express, vol. 23, No. 20, (2015), pp. 26426-26433.
Geints, Yu, E., et. al., "Modeling Spatially Localized Photonic Nanojets From Phase Diffraction Gratings". Journal of Applied Physics, vol. 119, No. 15, Apr. 21, 2016, pp. 153101-1-153101-6.
International Search Report and Written Opinion of the International Searching Authority for PCT/EP2019/055679 dated May 16, 2019, 10 pages.
International Preliminary Report on Patentability for PCT/EP19/055679 dated Sep. 15, 2020, 6 pages.
Kotlyar, Victor, et. al., "Photonic Nanojets Generated Using Square-Profile Microsteps". Optical Society of America, Applied Optics, vol. 53, No. 24, Aug. 20, 2014, pp. 5322-5329.
International Search Report and Written Opinion of the International Searching Authority for PCT/EP2019/055905 dated May 22, 2019, 12 pages.
International Preliminary Report on Patentability for PCT/EP2019/055905 dated Sep. 15, 2020, 8 pages.
Xiao, Jiasheng, et. al., "Design Of Achromatic Surface Microstructure For Near-Eye Display With Diffractive Waveguide". Optics Communications, vol. 452, (2019), pp. 411-416.
International Search Report and Written Opinion of the International Searching Authority for PCT/EP2019/063802 dated Sep. 16, 2019, 14 pages.
Ang, Angeleene S., et. al., "'Photonic Hook' Based Optomechanical Nanoparticle Manipulator". Scientific Reports, vol. 8. No. 2029, Published online: Feb. 1, 2018, pp. 1-7.
Chaumet, P. C., et. al., "Time-Averaged Total Force On A Dipolar Sphere In An Electromagnetic Field". Optics Letters. vol. 25, No. 15, (2000), pp. 1065-1067 (3 pages).
Xu, Chen, et. al., "Photon Nanojet Lens: Design, Fabrication and Characterization". Nanotechnology, vol. 27, No. 16, Mar. 4, 2016, pp. 1-6.
Yue, Liyang, et. al., "Photonic Hook: A New Curved Light Beam". Optics Letters, vol. 43, No. 4, Feb. 2018, pp. 771-774 (5 pages).

International Search Report and Written Opinion of the International Searching Authority PCT/EP2019/084526 dated Mar. 10, 2020, 15 pages.
Boriskin, Artem, et al., "Near Field Focusing By Edge Diffraction". Optics Letters, vol. 43, No. 16, Aug. 2018, pp. 4053-4056 (4 pages).
Shramkova, Oksana, et. al., "Localized Photonic Jets Generated By Step-Like Dielectric Microstructures". IEEE 20th International Conference on Transparent Optical Networks (ICTON), (2018), pp. 1-4. (4 pages).
Liu, Cheng-Yang, et. al., "Localized Photonic Nanojets Formed By Core-Shell Diffraction Gratings". Integrated Optics: Physics and Simulations III, International Society for Optics and Photonics, vol. 10242, (2017), p. 102420W (4 pages).
International Search Report and Written Opinion of the International Searching Authority for PCT/EP2019/063739 dated Aug. 8, 2019, (11 pages).
International Preliminary Report on Patentability for PCT/EP2019/063739 dated Jan. 5, 2021, (7 pages).
International Search Report and Written Opinion of the International Searching Authority for PCT/EP2019/086776 dated Mar. 6, 2020, 13 pages.
International Search Report and Written Opinion for PCT/EP2021/057273 dated Jun. 30, 2021 (15 pages).
International Preliminary Report on Patentability for PCT/EP2019/085489 dated Jun. 16, 2021, (8 pages).
International Preliminary Report on Patentability for PCT/EP2019/086776 dated Jun. 16, 2021, (9 pages).
Teranishi, N. et al.,"Evolution of optical structure in image sensors." In 2012 International Electron Devices Meeting, pp. 24-1 IEEE, 2012 (4 pages).
Nishiwaki, S. et al., "Highly Sensitive Image Sensors Using Micro Color Splitters." ITE Technical Report vol. 37 No. 47, Dec. 2014 (2 pages).
Chen, Q. et al., "Nanophotonic image sensors." Small 12, No. 36, 2016: 4922-4935 (14 pages).
Gennarelli, G.et al., "A uniform asymptotic solution for the diffraction by a right-angled dielectric wedge" IEEE transactions on antennas and propagation, vol. 59 No. 3, Mar. 2011 pp. 898-903 (6 pages).
Wang, P. et al., "Ultra-high-sensitivity color imaging via a transparent diffractive-filter array and computational optics: supplementary material." Optica, Oct. 2015 (9 pages).
Fontaine, R. "The state-of-the-art of mainstream CMOS image sensors." In Proceedings of the International Image Sensors Workshop, 2015 (4 pages).
Wang, P. et al., "Computational single-shot hyper-spectral imaging based on a microstructured diffractive optic." In 2016 Conference on Lasers and Electro-Optics (CLEO), IEEE, 2016 (2 pages).
Palanchoke, U. et al., "Spectral sorting of visible light using dielectric gratings." Optics Express 25, No. 26, Dec. 2017 pp. 33389-33399 (11 pages).
Rakovich, Y. P. et al., "Photonic Nanojets in Coupled Microcavities." In the European Conference on Lasers and Electro-Optics, p. JSV2_3. Optical Society of America, 2009 (1 page).
Yang, J. et al., "Polychromatic see-through near-eye display design with two waveguides and a large field-of-view." In Optics, Photonics and Digital Technologies for Imaging Applications IV, vol. 9896, p. 989605. International Society for Optics and Photonics, 2016 (7 pages).
International Preliminary Report on Patentability for PCT/EP2019/084526 dated Jun. 16, 2021, 11 pages.
Liu , Cheng-Yang, "Photonic Jets Produced by Dielectric Micro Cuboids". Applied Optics, vol. 54, Issue 29, (2015), pp. 8694-8699.
Varghese, B. et al., "Influence of an edge height on the diffracted EM field distribution." In 2019 21st International Conference on Transparent Optical Networks (ICTON), pp. 1-4. IEEE, 2019.
Shramkova, O. et al "Photonic nanojet generated by dielectric multi-material microstructure" META Jul. 2019, (2 pages).

* cited by examiner

IMAGE SENSOR COMPRISING A COLOR SPLITTER WITH TWO DIFFERENT REFRACTIVE INDEXES

The present application is a national stage application under 35 U.S.C. 371 of International Application No. PCT/EP2019/055905, entitled "IMAGE SENSOR COMPRISING A COLOR SPLITTER WITH TWO DIFFERENT REFRACTIVE INDEXES", filed on Mar. 8, 2019, which claims benefit from European Patent Application Serial No. 18305265.3, entitled "IMAGE SENSOR COMPRISING A COLOR SPLITTER WITH TWO DIFFERENT REFRACTIVE INDEXES", filed Mar. 13, 2018.

1. TECHNICAL FIELD

The present disclosure relates to the field of optics and photonics, and more specifically to optical devices used in image sensors.

2. BACKGROUND ART

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

In order to acquire color components during the acquisition of an image, usually an image sensor can either use a Bayer filter (which is a way of discretizing the color space, that requires the execution of a kind of interpolation later for generating a color image), or a Fovea sensor (being able to record three color components per pixel via a stack of color sensors, i.e. the color sensors are piled up on each other's).

In order to provide alternatives to the known techniques, it is proposed in the following a specific structure/architecture for achieving the color splitting functionality within image sensors.

3. SUMMARY

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In one aspect, it is proposed an image sensor comprising pixels for acquiring color information from incoming visible light, wherein said image sensor being associated with a three-dimensional cartesian coordinate system defined by axis x, y and z, wherein the z-axis being normal to said image sensor, said image sensor comprising at least two pixels being partially covered by a color splitter structure comprising a first part and a second part, that are positioned side by side along said x-axis, and each of said first and second parts being adjacent to a dielectric part along said x-axis, each of said dielectric part having a first refractive index $n_1$, said first part having a second refractive index $n_2$, and said second part having a third refractive index $n_3$, wherein $n_1 < n_3 < n_2$, and wherein according to a cross section with a plane xz, the first part of said color splitter structure has a first width $W_1$ along the x-axis, a height H along the z-axis and the second part of said color splitter structure has a second width $W_2$ along the x-axis, and the same height H along the z-axis, and wherein said color splitter structure further comprises, according to said cross-section:
 a first edge between one of said dielectric parts and said first part of said color splitter structure along said z-axis that can generate a first beam (NJ1) in a near field zone;
 a second edge between said first part of said color splitter structure and said second part of said color splitter structure along said z-axis that can generate a second beam (NJ2) in a near field zone;
 a third edge between said second part of said color splitter structure and one of said dielectric parts along said z-axis that can generate a third beam (NJ3) in a near field zone,
wherein said height H is substantially equal to a value $$H_B = \frac{W_1 + W_2}{\tan\Theta_{B1} + \tan\Theta_{B3}},$$

where $\Theta_{B1}$ and $\Theta_{B3}$ are respectively radiation angles of said first and said third beams, and wherein light associated with a first wavelength $\lambda_1$ is recorded by one of said at least two pixels and the other components of light by the other of said at least two pixels, wherein said first wavelength $\lambda_1$ belongs to one of ranges [390 nm, 450 nm] and [620 nm, 700 nm] of visible light.

With the invention, color components (such as the blue, green and red components) of the light are deviated in different directions that can be later recorded by different photodiodes or pixels of the image sensor.

Indeed, lengths of the NJ beams generated by the edges of the color splitter structure, at the interface between two different materials, are directly proportional to the incident wavelength. These NJs will interfere and the result will determine which direction is the overall splitting direction for the color splitter element. The design rule $H=H_B$ gives a simple recipe for the case where these two directions are easily distinguishable and so the color splitting is pronounced.

In a variant, the image sensor has parameters with $n_3 > \sqrt{n_1 n_2}$ and a width W of said color splitter structure, equal to $W_1+W_2$, is greater than 390 nm, and said one of said at least two pixels that records light associated with said first wavelength $\lambda_1$ is located at the normal of said first part of said color splitter structure, in the case said first wavelength $\lambda_1$ belongs to the range [620 nm, 700 nm] of visible light.

In a variant, the image sensor has parameters with $n_3 > \sqrt{n_1 n_2}$ and a width W of said color splitter structure, equal to $W_1+W_2$, is greater than 390 nm, and said one of said at least two pixels that records light associated with said first wavelength $\lambda_1$ is located at the normal of said second part of said color splitter structure, in the case said first wavelength $\lambda_1$ belongs to the range [390 nm, 450 nm] of visible light.

In a variant, the image sensor has parameters with $n_3 < \sqrt{n_1 n_2}$ and a width W of said color splitter structure, equal to $W_1+W_2$, is greater than 390 nm, and said one of said at least two pixels that records light associated with said first wavelength $\lambda_1$ is located at the normal of said second part of said color splitter structure, in the case said first wavelength $\lambda_1$ belongs to the range [620 nm, 700 nm] of visible light.

In a variant, the image sensor has parameters with $n_3 < \sqrt{n_1 n_2}$ and a width W of said color splitter structure, equal to $W_1+W_2$, is greater than 390 nm, and said one of said at least two pixels that records light associated with said first wavelength $\lambda_1$ is located at the normal of said first part of said color splitter structure, in the case said first wavelength $\lambda_1$ belongs to the range [390 nm, 450 nm] of visible light.

In a variant, said visible light comprises electromagnetic waves having wavelengths that go from 390 nm to 700 nm.

In a variant, said first width $W_1$ and said second width $W_2$ are equal to each other.

In a variant, each pair of pixels is partially covered by a structure identical to said color splitter structure.

In a variant, each pair of pixels is partially covered by a structure that is alternatively either a structure identical to said color splitter structure, or a structure comprising first and second parts which are inverted compared to said color splitter structure.

In a variant, each successive structure is separated by an identical dielectric part having a width, along the x-axis, equal to $W_3$, and wherein the value of $W_3$ is comprised between 250 nm and 600 nm.

In a variant, each first and second part, and said dielectric part are made of a material that belongs to the group comprising:
glass;
plastic;
a polymer material;
oxides;
nitrides.

In a variant, at least one pixel of said at least two pixels further comprises conventional color filter positioned between said color splitter structure and photosensitive materials associated with each of said at least two pixels.

In a variant, said height H is around ±5% of the value $H_B$.

In a variant, said radiation angles of said first and said third beams $\Theta_{B1}$ and $\Theta_{B3}$ are equal to $$90° - \frac{\Theta_{TIRj} + \alpha_j}{2},$$

where angles $\alpha_j$, with j equals to 1 or 3, are the base angles for said first and third edges, and $\Theta_{TIBj}$, with j equals to 1 or 3, are critical angles of refraction associated with respectively said first and third edges.

In a variant, the image sensor is remarkable in that said one of said at least two pixels that records light associated with said first wavelength $\lambda_1$, further receives light associated with said first wavelength from another neighbor color splitter structure.

In a variant, the image sensor is remarkable in that said other of said at least two pixels further receives light, having a spectrum in which no or few electromagnetic waves having a wavelength equal to $\lambda_1$ are present, from another neighbor color splitter structure.

4. BRIEF DESCRIPTION OF THE DRAWINGS

Figure 3:
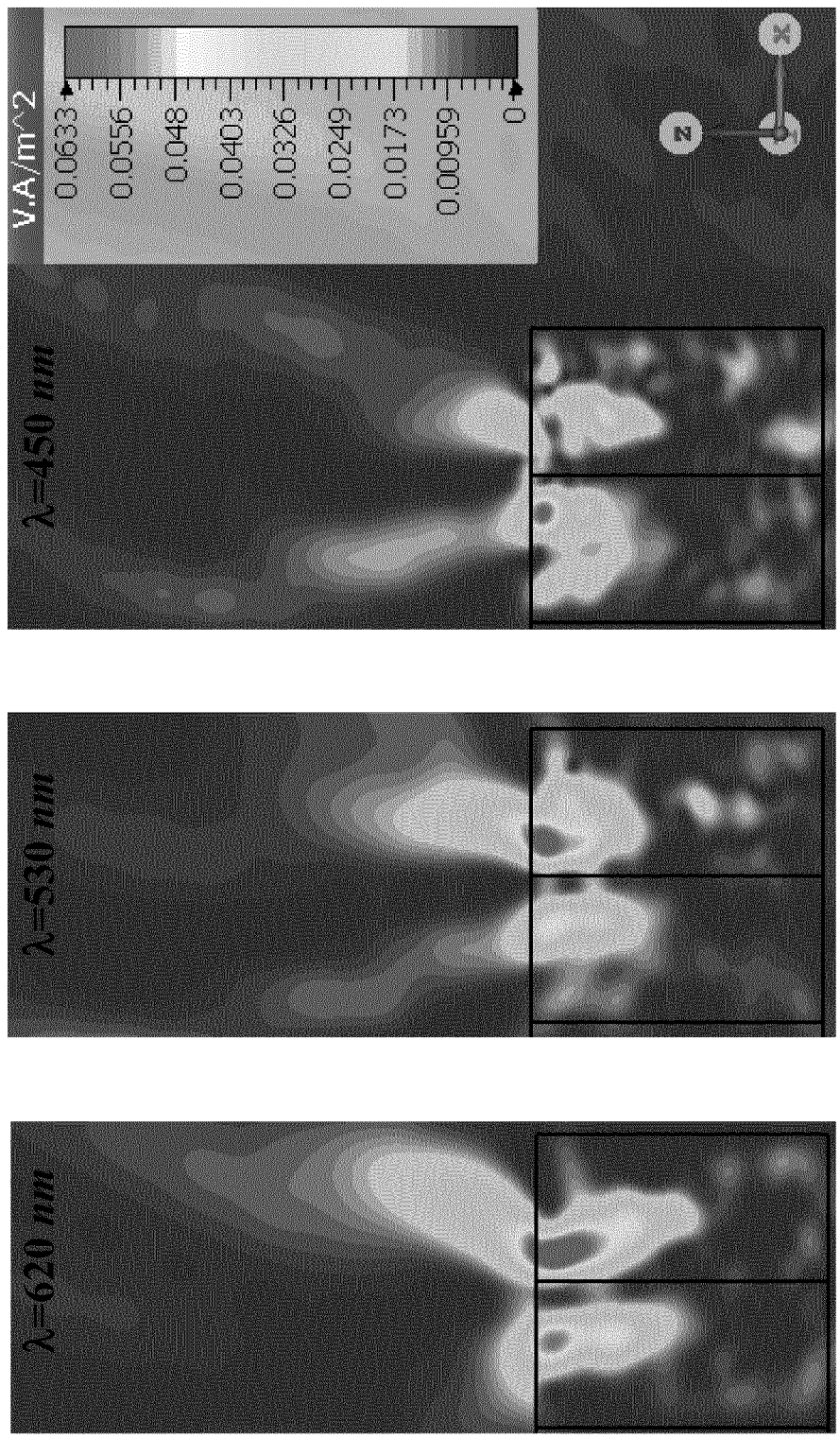
Figure 4A:
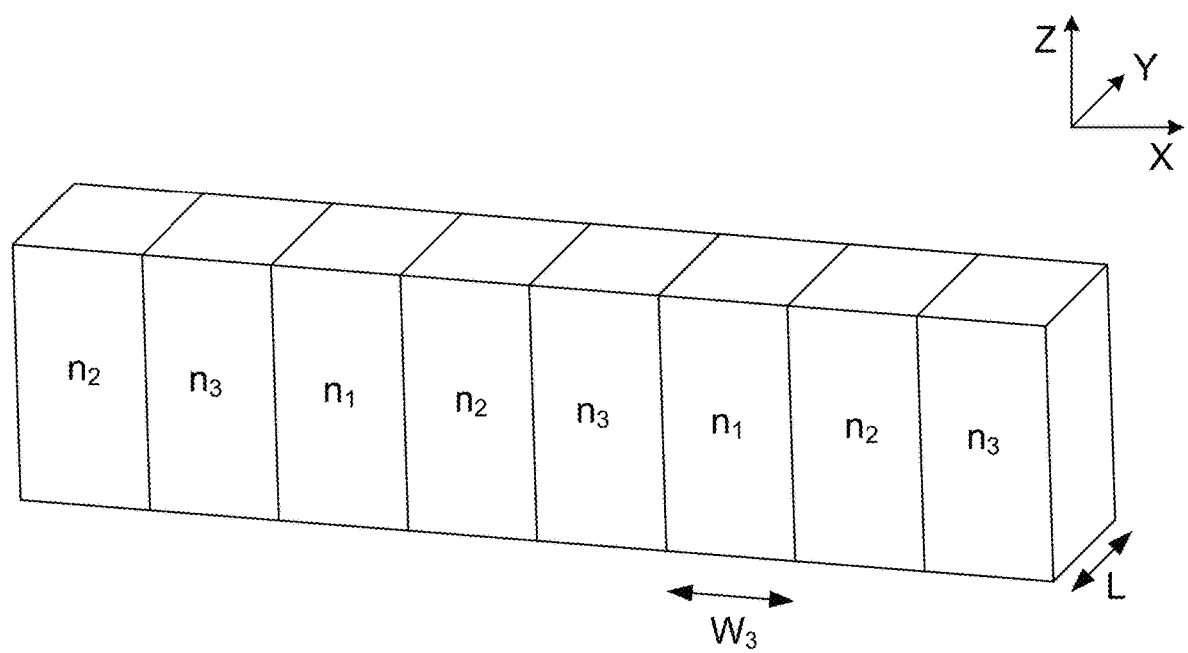
Figure 4B:
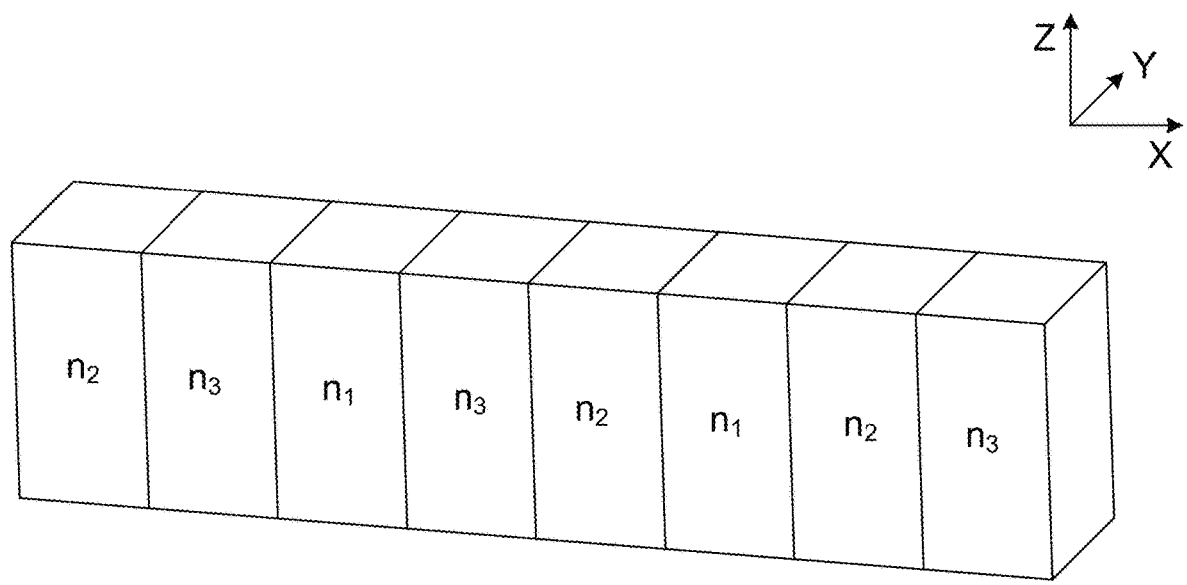
Figure 10A:
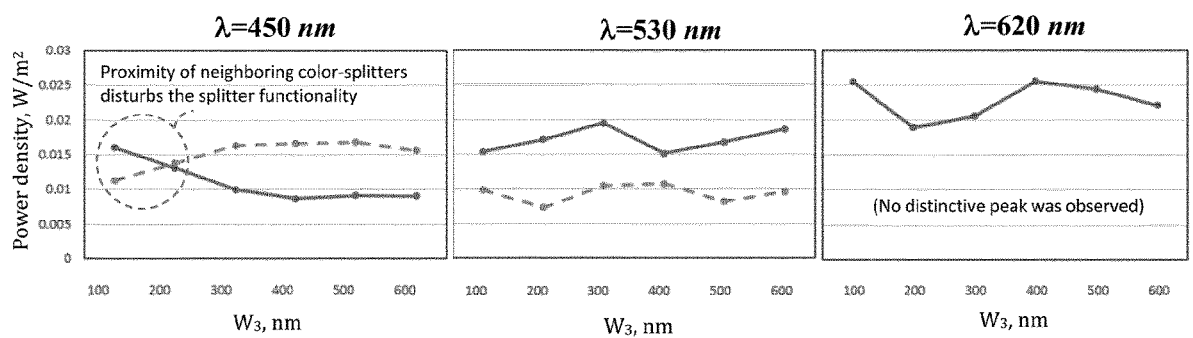
Figure 10B:
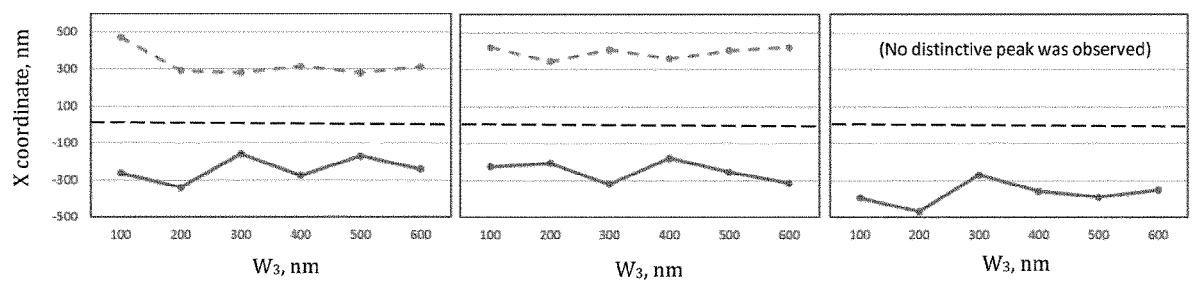
Figure 11A:
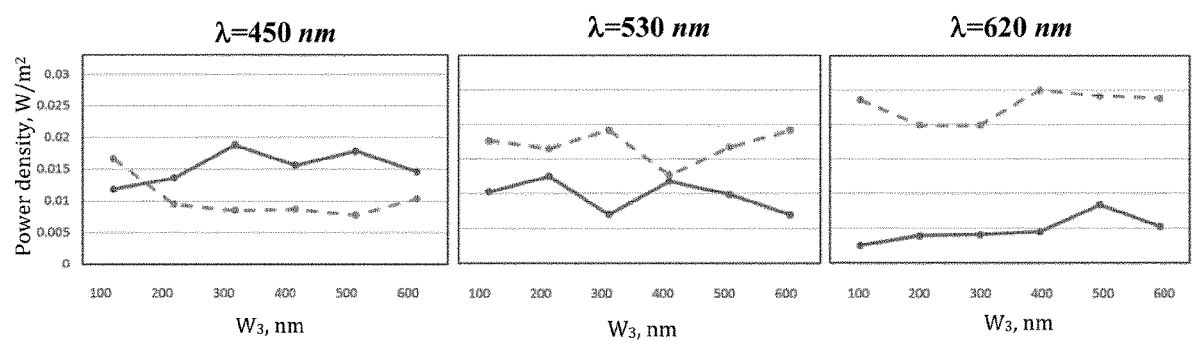
Figure 11B:
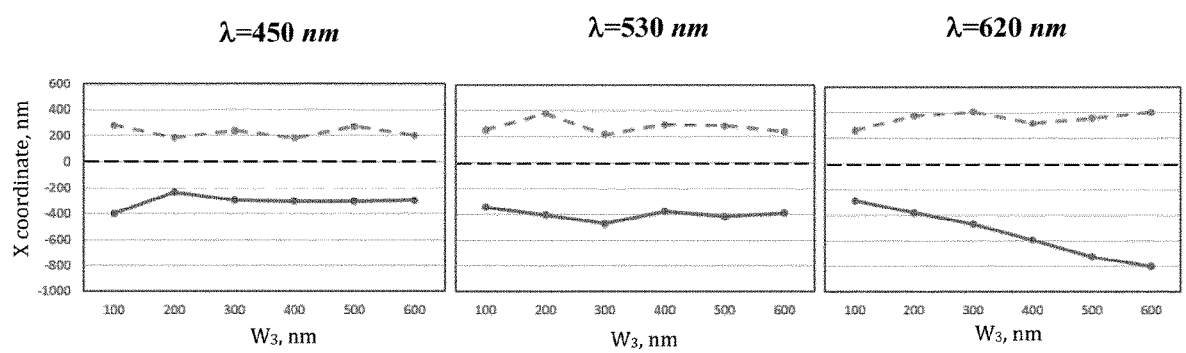
Figure 12A:
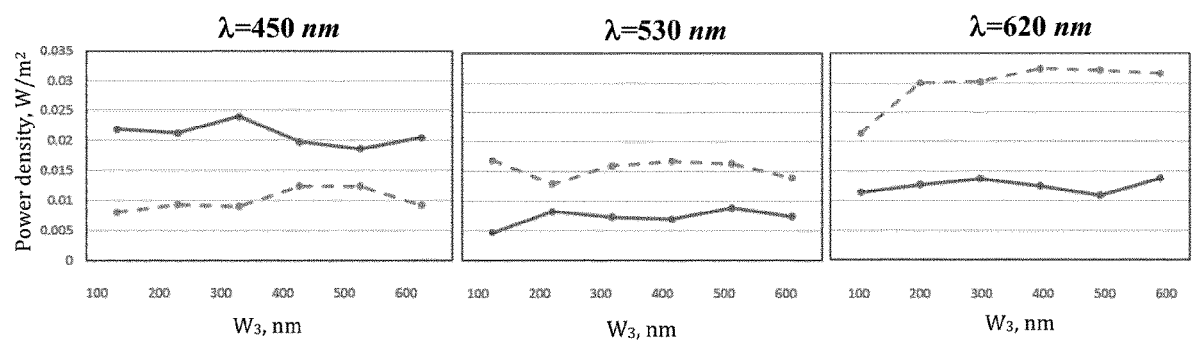
Figure 12B:
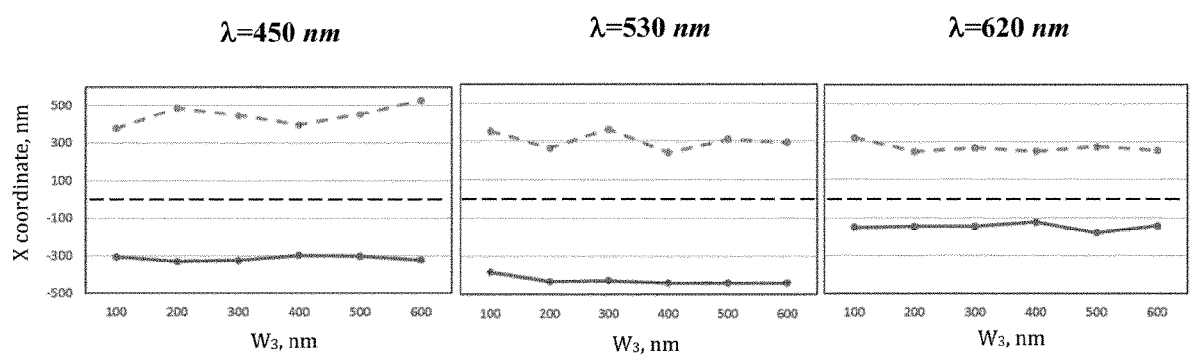
Figure 13A:
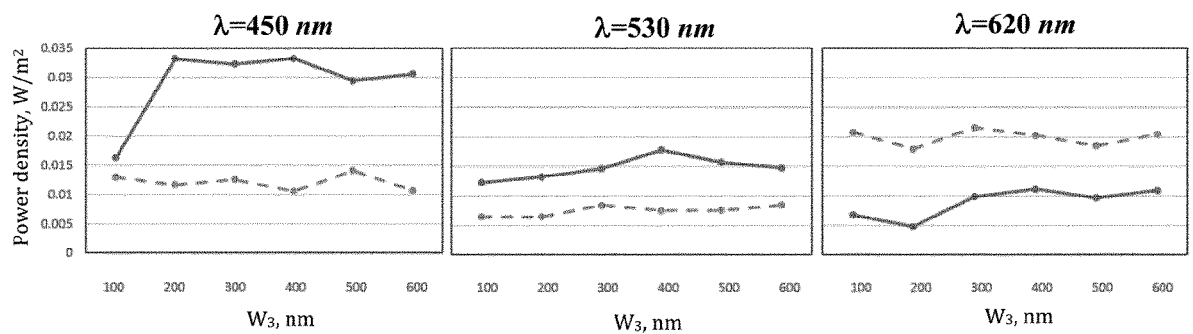
Figure 13B:
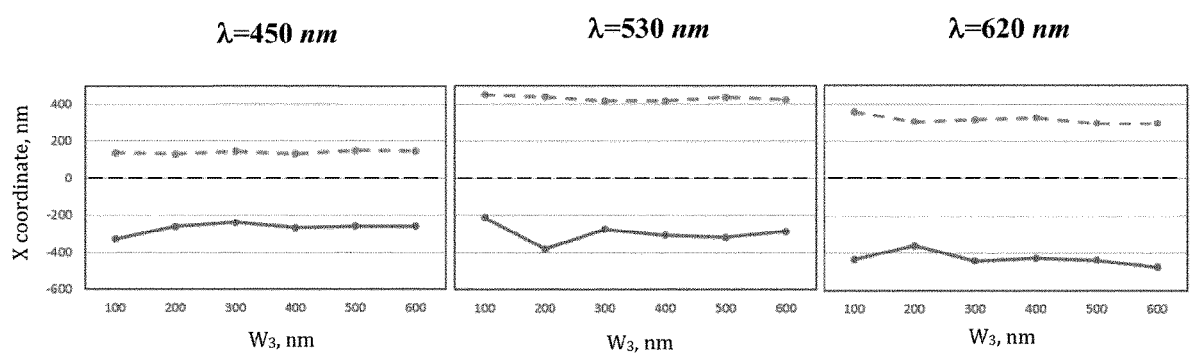
Figure 17A:
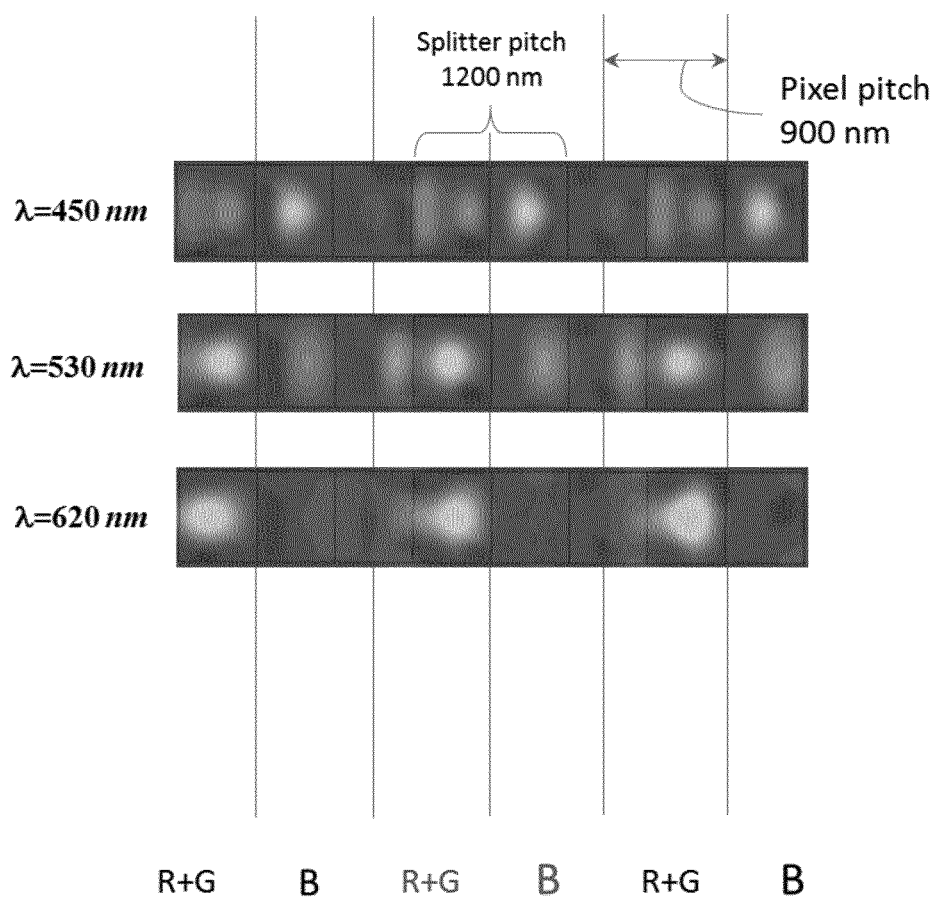
Figure 17B:
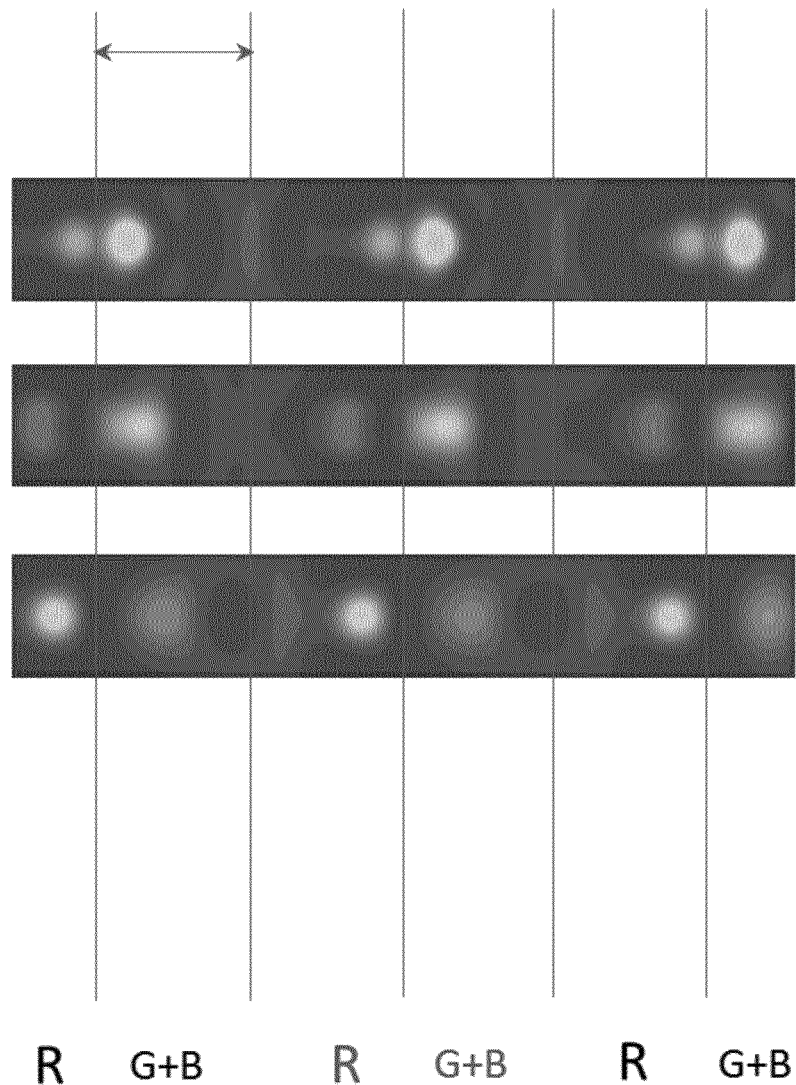
Figure 18:
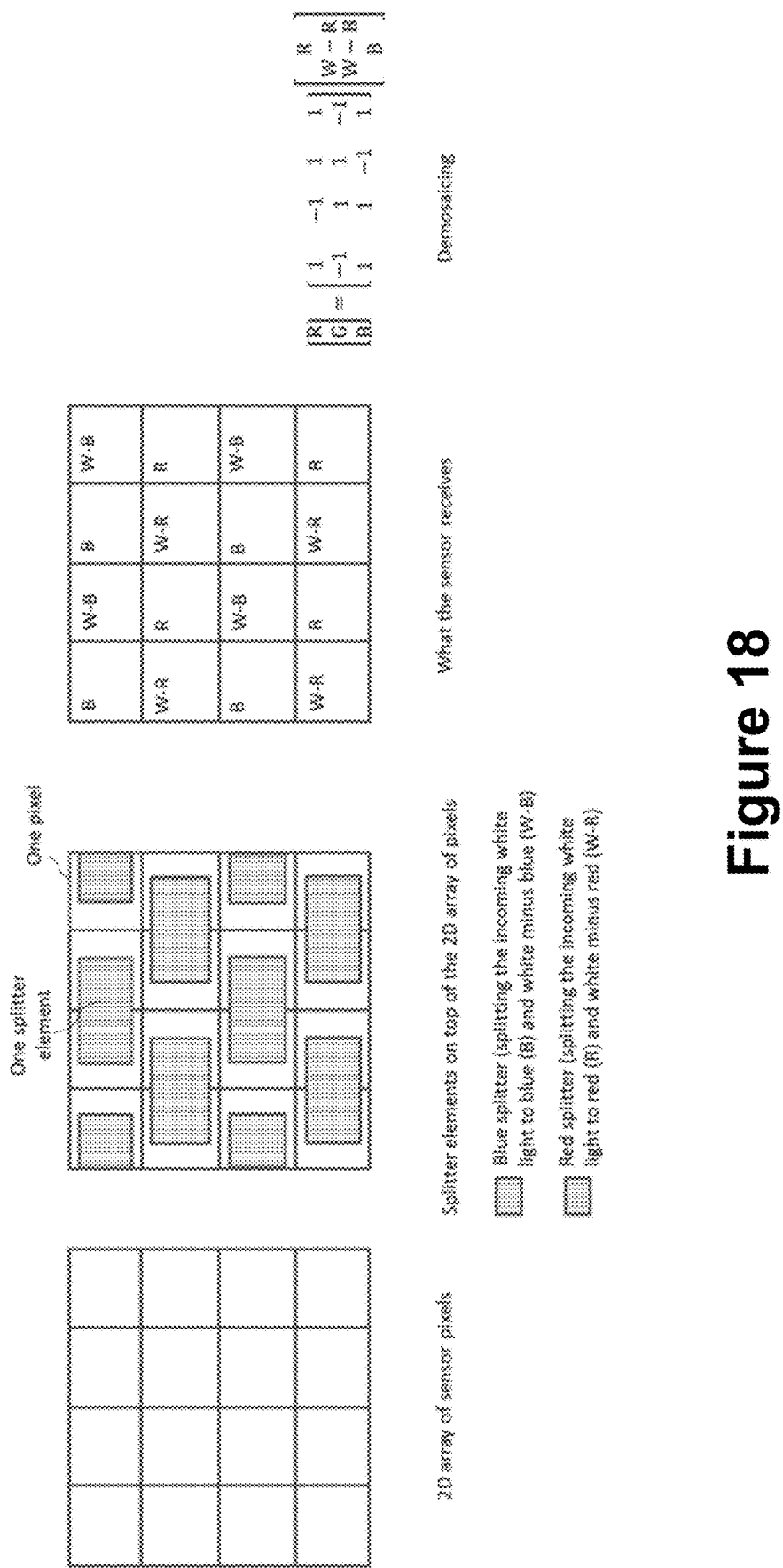
Figure 19:
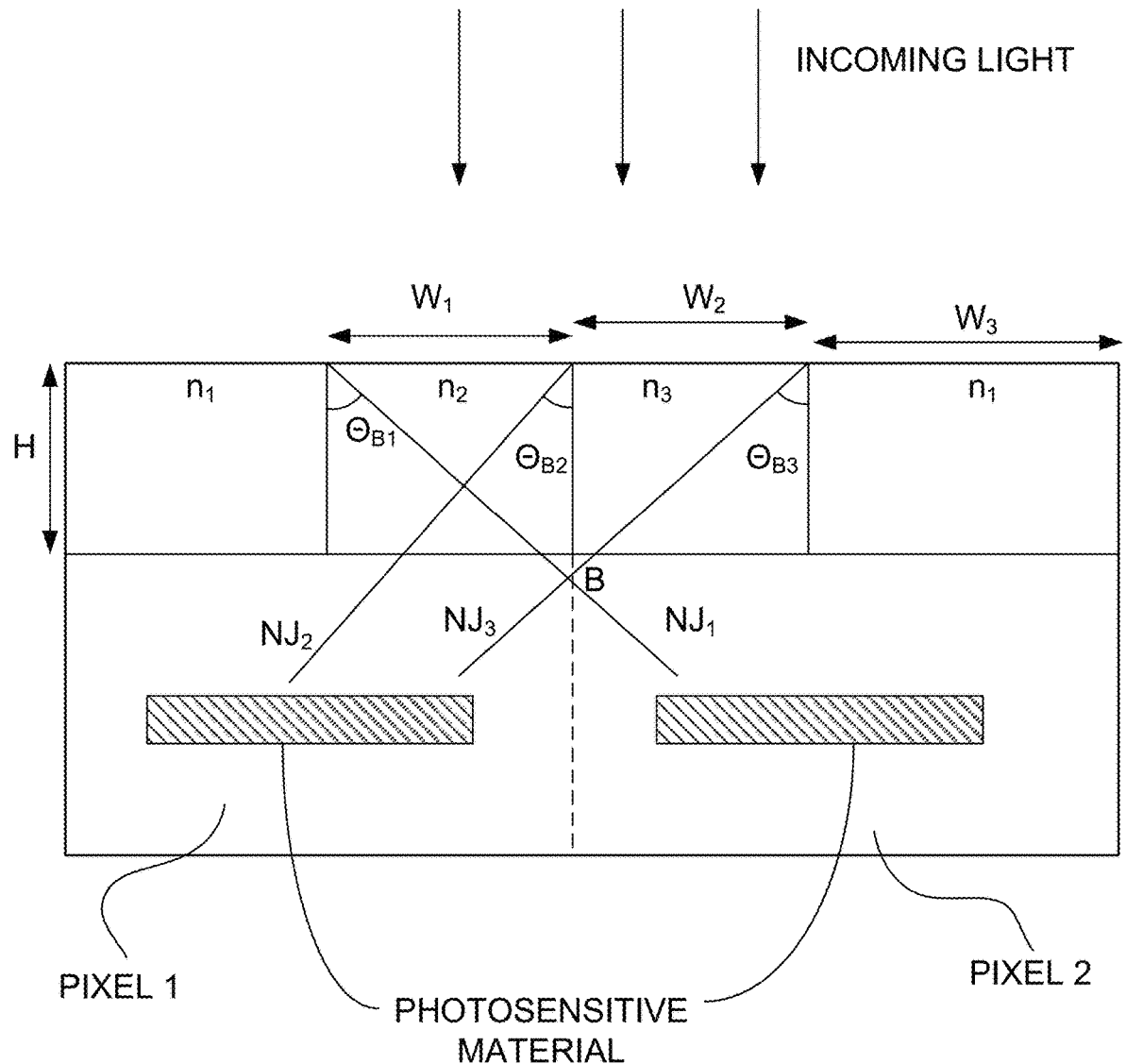
Figure 20:
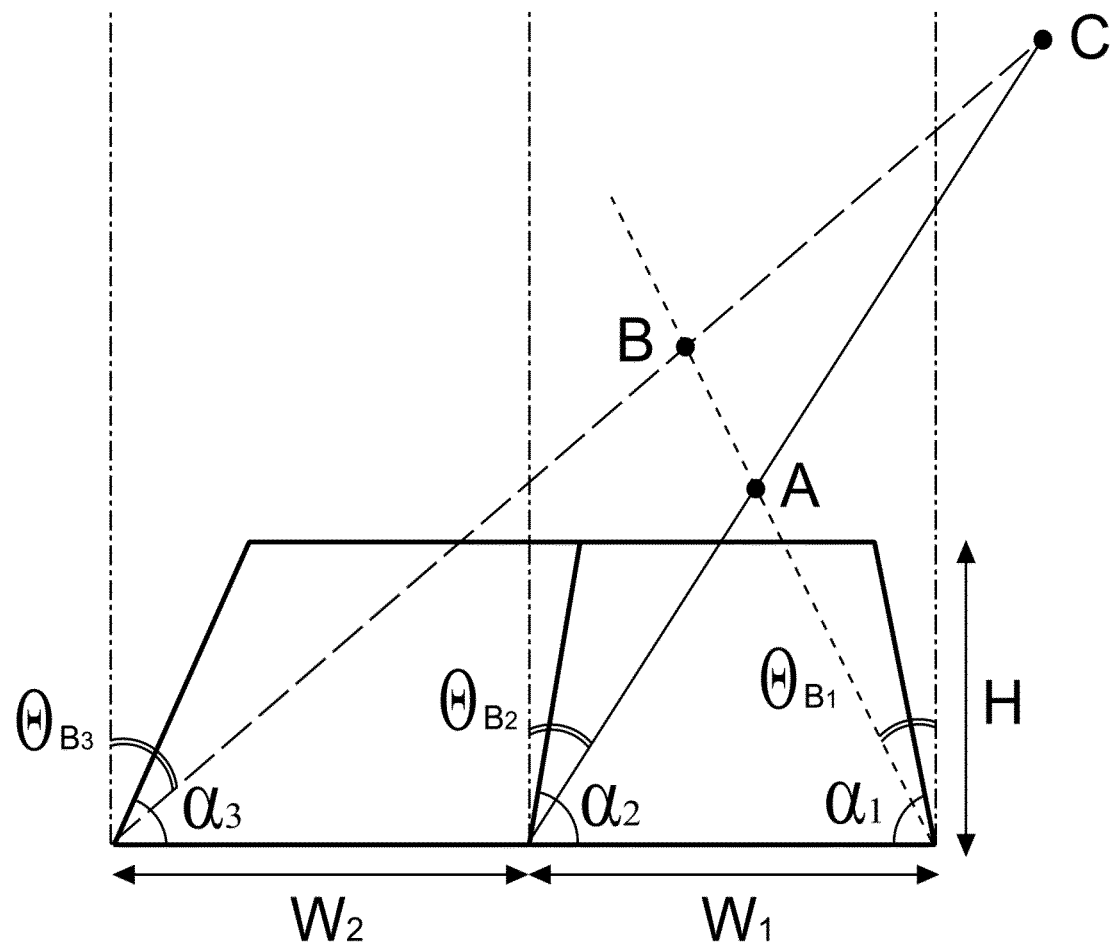

The present disclosure can be better understood with reference to the following description and drawings, given by way of example and not limiting the scope of protection, and in which:

FIG. 1 illustrates the cross-section view, in a XZ plane of a double-material structure according to an embodiment of the present disclosure;

FIGS. 2(a)-(d) present roughly the same structure as in FIG. 1 but adapted to the context of the color splitting problem;

FIG. 3 presents the power density distribution, for three different incident electromagnetic waves, having for respective wavelength $\lambda$=620 nm (i.e. red light), $\lambda$=530 nm (i.e. green light), and $\lambda$=450 nm (i.e. blue light), in xz-plane for the structure defined with such parameters: n1=1, n2=1.8, n3=1.6, W1=W2=600 nm; and H=1200 nm;

FIGS. 4(a) and (b) present two different topologies of arrays of double-material structures according to embodiments of the disclosure;

FIGS. 5(a)-(f) and FIGS. 6(a)-(f) illustrate power density distribution in the xz- and xy-planes at wavelengths corresponding to the blue, green and red colors for two arrays of double-material dielectric structures with $n_3 > \sqrt{n_1 n_2}$, according to embodiments of the disclosure;

FIGS. 7(a)-(f) show the power density distribution in the xz- and xy-planes at wavelengths corresponding to the blue, green and red colors for a second periodic arrangement (FIG. 4(b)) of double-material dielectric structure with $n_3 \sqrt{n_1 n_2}$;

FIGS. 8(a)-(f) show the power density distribution in the xz- and xy-planes at wavelengths corresponding to the blue, green and red colors for a periodic arrangement (FIG. 4(a)) of double-material dielectric structure with $n_3 < \sqrt{n_1 n_2}$, according to one embodiment of the disclosure;

FIGS. 9(a)-(f) show the power density distribution in the xz- and xy-planes at wavelengths corresponding to the blue, green and red colors for a periodic arrangement (FIG. 4(b)) of double-material dielectric structure with $n_3 < \sqrt{n_1 n_2}$, according to one embodiment of the disclosure;

FIG. 10 present a peak power density (a) and X-coordinate of NJ hot spot (b) versus W3 for the single (central) element of the array presented in FIG. 4(a) with such parameters $n_1$=1, $n_2$=1.8, $n_3$=1.6, $W_1$=$W_2$=600 nm, H=1200 nm, Z=1700 nm;

FIG. 11 present a peak power density (a) and X-coordinate of NJ hot spot (b) versus W3 for the single (central) element of the array presented in FIG. 4(b) with such parameters $n_1$=1, $n_2$=1.8, $n_3$=1.6, $W_1$=$W_2$=600 nm, H=1200 nm, Z=1700 nm;

FIG. 12 present a peak power density (a) and X-coordinate of NJ hot spot (b) versus W3 for the single (central) element of the array presented in FIG. 4(a) with such parameters $n_1$=1, $n_2$=2, $n_3$=1.2, $W_1$=$W_2$=600 nm, H=1300 nm, Z=1500 nm;

FIG. 13 present a peak power density (a) and X-coordinate of NJ hot spot (b) versus W3 for the single (central) element of the array presented in FIG. 4(b) with such parameters $n_1$=1, $n_2$=2, $n_3$=1.2, $W_1$=$W_2$=600 nm, H=1300 nm, Z=1500 nm;

FIGS. 14(a)-(f) and 15(a)-(f) show the power density distribution in xz- and xy-for 1D arrays of NJ-based dielectric color splitters presented in FIG. 4(b) and $\Theta_i$=±15° (i.e. for non-normal incident electromagnetic waves);

FIG. 16(a)-(f) show the power density distribution in xz- and xy-for 1D arrays of NJ-based dielectric color splitters presented in FIG. 4(b) and $\Theta_i$=±30° (i.e. for non-normal incident electromagnetic waves);

FIGS. 17(a) and 17(b) illustrate the splitting effect of the color splitter microstructures from FIGS. 5(a)-(f) and FIGS. 6(a)-(f);

FIG. 18 presents an embodiment showing the 2D arrangement of the splitter elements on top of the regular 2D grid of the image sensor pixels, together with a suggested demosaicing function;

FIG. 19 presents an embodiment where a color splitter structure as previously presented partially covers at least two pixels;

FIG. 20 provides a cross-section view of a double-material structure with nonvertical edges.

The components in the figures are not necessarily to scale, emphasis instead being placed upon illustrating the principles of the invention.

5. DETAILED DESCRIPTION

The present disclosure relates to a technique for splitting color-bands of an incident visible light by combining two or more dielectric materials with different refractive indexes (the refractive indexes of constitutive parts are higher than the surrounding material) in such a way that all the nanojets (NJ) beams, originating from different edges (associated with different blocks/layers) of the microstructure, recombine and contribute to the formation of a spectral-dependent NJ beam deflection.

For reminders, the generation of NJ beams is described in document EP 3 223 063. Numerical simulations demonstrate that proposed principle of color splitting based on the NJ beam deflection can generate focused color images. The characteristics of the generated NJ beams are controlled by the parameters of the corresponding blocks, i.e. refractive index ratios between the blocks, dimensions of the blocks and angle of wave incidence.

In the following an element or structure that can perform such color splitting or deviating structure is a specific configuration of a more general design of a NJ beam forming element (also called hereafter a double-material structure) which is a combination of at least two dielectric materials with different refractive indexes having a nonsymmetrical or a symmetrical system in a vertical cross-section. Hereafter, structures having such a topology are referred to as structures based on a combination of different materials.

5.1 Topology

FIG. 1 illustrates the cross-section view, in a XZ plane of a double-material structure 10 according to an embodiment of the present disclosure.

Such a double-material structure 10, in cross-section view, corresponds to a combination of two different blocks of materials, referenced 12 and 13. Such blocks 12, 13 may have a shape of cuboid, for example in the 3D XYZ space, or a shape of semi-circular ring. Their cross-section is rectangular (as illustrated in FIG. 1), but could also be trapezoidal or cuboid-shaped.

Blocks referenced 12 and 13 respectively have refractive indexes $n_2$ and $n_3$ ($n_2 > n_3$) embedded in a homogeneous dielectric host medium 11 with a refractive index $n_1 < n_3$. For simplicity, we assume that all the materials are lossless and non-dispersive.

Blocks 12 and 13 could also be placed on a dielectric substrate (not illustrated) acting as a support layer.

Block 12 has a width $W_1$ and a height H, while block 13 has a width $W_2$ and the same height H.

Hereafter, we consider that blocks 12, 13 have vertical edges parallel to z-axis and top/bottom surfaces parallel to xy-plane, which corresponds to a base angle α=90°. However, some prismatic structures (with arbitrary base angles) can also be used. Variation of the base angle value provides additional degree of freedom in the control of the NJ beam radiation.

The double-material structure 10, once it receives an incident light or electromagnetic wave 14, generates several nanojets beams (the three nanojets beams NJ1, NJ2 and NJ3 generated respectively by edges of the double-material structure 10) that can intersect in different hot spots or focused points or locations referenced as points A, B and C.

According to the present disclosure, the materials and size of the constitutive parts 11, 12 and 13 can be optimized in order to manage the position of NJ hot spots, intensity, direction and angle of deviation of NJ beams.

5.2 Design Principles & Main Performance Characteristics

In this Section, we present a set of equations to estimate the optimal combinations of materials and dimensions of the blocks 12, 13 for NJ beam shift and deviation. The hot spot position and direction of beam deviation are sensitive to the sizes ($W_1$, $W_2$, H) of constitutive parts. For structures 10 with dimensions larger than a few wavelengths the Fresnel diffraction phenomenon will have a huge impact.

5.2.1 Main Characteristics of Generated NJ Beams

As demonstrated in patent document EP 3 223 063 in the name of the same Applicant, the beam-forming phenomenon appears on an edge between two materials of different refractive indexes, and is associated solely with this edge. The ratio of refractive indexes between both materials contributes to controlling an elevation angle of the generated nanojet beam, which is an angular position of a projection of the NJ beam in the vertical xz plane. Actually, the NJ beam radiation angle is defined by the Snell's law and can be determined using the approximate formula:

$$\Theta_{B1} \approx \frac{90° - \Theta_{TIR1}}{2}, \quad (1)$$

where $$\Theta_{TIR1} = \sin^{-1}\left(\frac{n_1}{n_2}\right)$$

is the critical angle of refraction, $n_1$ is the refractive index of the host medium 11, and $n_2$ is the refractive index of a part of the double-material structure. The point of intersection of two equal NJ beams radiated from the opposite sides of the element determines the focal length of the NJ structure. In a first approximation, in the case of a single material element the focal length of the NJ structure can be characterized as the function of the size (width) and index ratio of the media inside and outside the structure. The total radiated NJ beam will be directed along the symmetry axis of the system.

As illustrated in FIG. 1, when a second element 13 with refractive index $n_3$ and width $W_2$, is attached in direct contact with the first element 12 with refractive index $n_2$, the angle of NJ beam radiation from the boundary between both elements 12, 13 will not remain equal to $\Theta_{B1}$. The new NJ beam will be refracted at the angle $\Theta_{B2}$ into the medium with higher refractive index. If $n_2 > n_3$ we will determine angle $\Theta_{B2}$ as:

$$\Theta_{B2} \approx \frac{90° - \Theta_{TIR2}}{2}, \quad (2)$$

where $$\Theta_{TIR2} = \sin^{-1}\left(\frac{n_3}{n_2}\right).$$

The NJ beam radiation angle at the third edge, between block 13 and host medium 11, corresponds to:

$$\Theta_{B3} \approx \frac{90° - \Theta_{TIR3}}{2}. \quad (3)$$

Here $$\Theta_{TIR3} = \sin^{-1}\left(\frac{n_1}{n_3}\right).$$

Let us note that the length and intensity of these three NJs, generated by the three edges between the materials 11, 12 and 13 with different refractive indexes, will be different. The maximal intensity and minimal length correspond to the beam with highest ratio between the refractive indexes. In the exemplary case illustrated in FIG. 1, it will be the NJ refracted at the angle $\Theta_{B1}$ generated at the boundary between block 12 and host medium 11.

The three nanojet beams generated at the boundaries between the materials of different refractive indexes of optical device 10 may partially or totally combine, to produce a total focused beam, which corresponds to the interference pattern caused by the three primary nanojet beams associated with the three edges of device 10.

To explain the behavior of total NJs radiated by the double-material structure 10, we should determine the points of intersection (denoted A, B and C on FIG. 1) of these initial, or primary, NJs associated with the edges of the system 10 and radiated at the angles $\Theta_{B1}$, $\Theta_{B2}$ and $\Theta_{B3}$.

The point A of first (NJ1) and second (NJ2) NJs' intersection has the coordinates ($W_A$,$H_A$), where:

$$W_A \approx \tan\Theta_{B2} \cdot H_A, \quad (4)$$

$$H_A \approx \frac{W_1}{\tan\Theta_{B1} + \tan\Theta_{B2}}.$$

First (NJ1) and third (NJ3) NJs will intersect at a point B with the coordinates ($W_B$,$H_B$), where:

$$W_B \approx \tan\Theta_{B3} \cdot H_B - W_2, \quad (5)$$

$$H_B \approx \frac{W_1 + W_2}{\tan\Theta_{B1} + \tan\Theta_{B3}}.$$

It is necessary to note, that second (NJ2) and third (NJ3) nanojets will intersect only if $n_3 \geq \sqrt{n_1 n_2}$. In this case, the coordinates of the point C will be determined as:

$$W_C \approx \tan\Theta_{B3} \cdot H_C - W_2, \quad (6)$$

$$H_C \approx \frac{W_2}{\tan\Theta_{B3} - \tan\Theta_{B2}},$$

Our numerical simulations presented below have demonstrated that spectral-dependent NJ beam deflection for 3 different wavelengths ($\lambda_1 < \lambda_2 < \lambda_3$) is observed for $W \cong \lambda_2$ and $H \cong H_B$. For such parameters of the system, the direction of NJ deviation depends on the wavelength of incident wave. Particularly, we have observed that for $n_3 > \sqrt{n_1 n_2}$ (FIG. 2(b)) at $\lambda = \lambda_1$ we obtain long intensive NJ deviated towards the part with lower refractive index $n_3$. In this case the main input will be from the short but most intensive NJ associated with the right edge of the system in FIG. 2(b)—NJ1. For a case of longer wavelengths ($\lambda = \lambda_{2,3}$) the maximal total response will be determined by the input of the NJ2 and NJ3 beams which are longer but less intensive. As the result, the long intensive NJs will be deviated towards the part with higher refractive index $n_2$. Taking $n_3 < \sqrt{n_1 n_2}$ (FIG. 2(c)) we observe the opposite situation. It will be demonstrated that at $\lambda = \lambda_1$ the main input is NJ3 (for the chosen parameters NJ3 is less intensive than NJ1 and NJ2) and resulting NJ is deviated towards the part with higher refractive index $n_2$. The most intensive Nil determines the response of the system at $\lambda = \lambda_2$. For both discussed cases response of the system at $\lambda = \lambda_3$ is related to the input of the NJs of medium intensity.

Here, we discuss the influence of the angle of plane wave incidence ($\theta_i$, FIG. 2d) on the characteristics of proposed double-material NJ microlens. It is necessary to take into account that for oblique incidence the approximate formula for NJ beam radiation angles should be modified and will be presented in the form:

$$\Theta_{B1} \approx \left| -\frac{90° - \theta_{TIR1}}{2} + \frac{\Theta_i}{2} \right|, \quad (7)$$

$$\Theta_{B2} \approx \frac{90° - \theta_{TIR2}}{2} + \frac{\Theta_i}{2},$$

$$\Theta_{B3} \approx \frac{90° - \theta_{TIR3}}{2} + \frac{\Theta_i}{2}.$$

To obtain the value of the height HB, we should substitute these angles into eq.(5).

5.2.2 Color Splitter Functionality

Based on the identified properties of the structure depicted in the FIG. 1, it is proposed in the following to determine how to adapt the parameters of such structure (i.e. the refractive index values, and/or the width and/or the height of such structure) in order to obtain a color splitter function. Such color splitter function is of interest especially in the field of the image sensors.

Indeed, in one embodiment of the disclosure, it is possible to deviate color components (such as the blue, green and red components) of the light in different directions that can be later recorded by photodiodes in an image sensor.

The FIGS. 2(a)-(d) present roughly the same structure as in FIG. 1 but adapted to the context of the color splitting problem.

FIG. 3 presents the power density distribution, for three different incident electromagnetic waves, having for respective wavelength $\lambda = 620$ nm (i.e. red light), $\lambda = 530$ nm (i.e. green light), and $\lambda = 450$ nm (i.e. blue light), in xz-plane for the structure defined with such parameters: $n_1 = 1$, $n_2 = 1.8$, $n_3 = 1.6$, $W_1 = W_2 = 600$ nm; and H=1200 nm.

Hence, FIG. 3 presents the power density distribution in xz-plane with $n_3 > \sqrt{n_1 n_2}$. More precisely, in FIG. 3, the height H of the structure is chosen such as $H \cong H_B$ i.e. the focus point B is close to the surface of the structure.

It is possible to see 2 Nis (one NJ is the combination of NJ1 and NJ2) of different length situated above the constitutive parts of the structure. The length of these NJs is different (longest NJ is situated above the part with higher refractive index $n_2$). By selecting the height of the structure up to or around $H \cong H_B$ we can observe redistribution of the power density between two generated NJs situated above the constitutive parts of the structure. As the result, we obtain that for $\lambda=450$ nm right NJ will be longer than left. So, at some distance from the top surface of the element, we will observe that the spot for a blue color will be situated above the part with lower refractive index and the spots for green and red colors will be above the part with higher refractive index. Hence, the spectral-dependent NJ beam deflection takes place if $H \cong H_B$ and focal point B for the NJs related to the external boundaries of the structure (NJ1 and NJ3) is close to the surface of structure or within the structure. Playing with the materials of the layers, we can change power density distribution for different colors.

5.2.3 Arrays of Structures, Normal Incidence

To study the mutual influence of the neighbouring NJs on the power density redistribution, we consider two different arrays of double-material structures. The investigated topologies are presented in FIGS. 4(a) and (b). First array (FIG. 4(a)) corresponds to the periodic alternation of the double-material structures separated by the blocks with refractive index $n_1$ (in our numerical simulations $n_1$ is the refractive index of the host medium). We assume that $W_3$ is the width of this block (i.e. the block having a material with a refractive index equal to $n_1$). For the second array (FIG. 4(b)) medium with refractive index $n_1$ separate the blocks with the same refractive indexes.

FIGS. 5(a)-(f) and FIGS. 6(a)-(f) illustrate power density distribution in the xz- and xy-planes at wavelengths corresponding to the blue, green and red colors for two arrays of double-material dielectric structures with $n_3 > \sqrt{n_1 n_2}$. Each array contains three double-material structures. We assume that the distance between the elements is about one wavelength ($W_3=600$ nm). We can see that for such distance $W_3$ the neighbouring NJs will affect each other just slightly. Placing the detector at the distance $Z=1700$ nm we can easily distinguish spots corresponding to the different colors. But for second arrangement of the elements (the arrangement is presented in FIG. 4(b)) the intensity of the NJ for blue color is higher and distance between the spots for green and red colors is bigger. So, second arrangement is preferable for color splitter application.

Figure 5A:
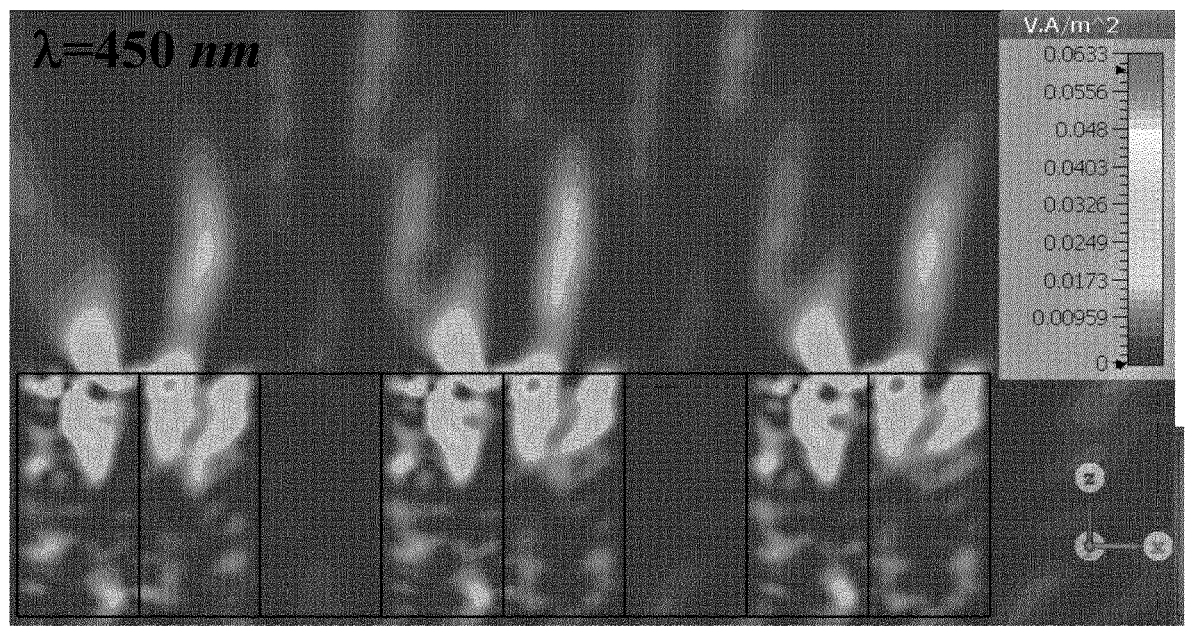

More precisely, FIGS. 5(a), (c) and (e) present the power density distribution in a xz-plane (Y=0) for the array presented in FIG. 4(a) with such parameters: $n_1=1$, $n_2=1.8$, $n_3=1.6$, $W_1=W_2=W_3=600$ nm, $H=1200$ nm.

Figure 5B:
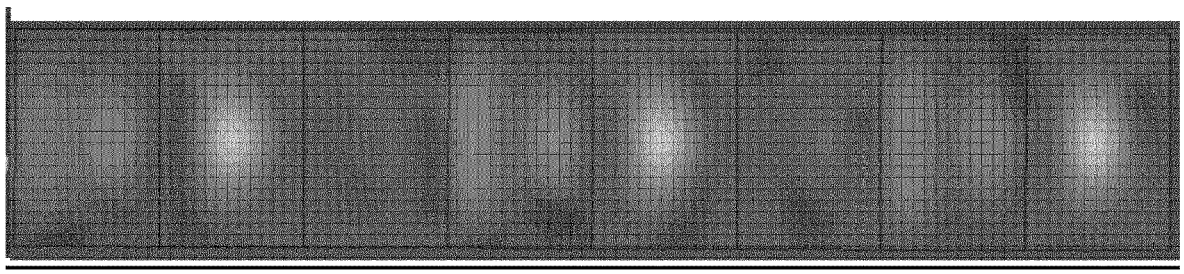
Figure 5C:
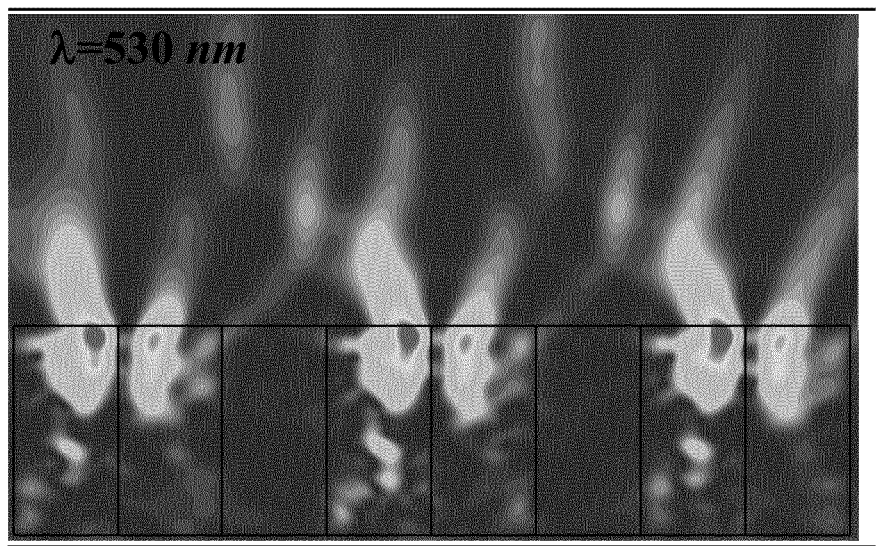
Figure 5D:
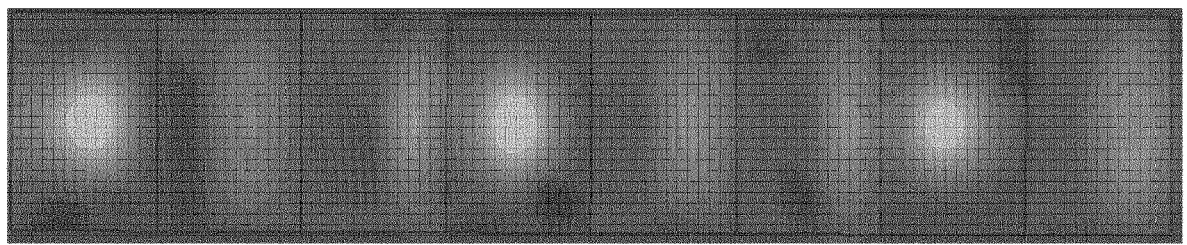
Figure 5E:
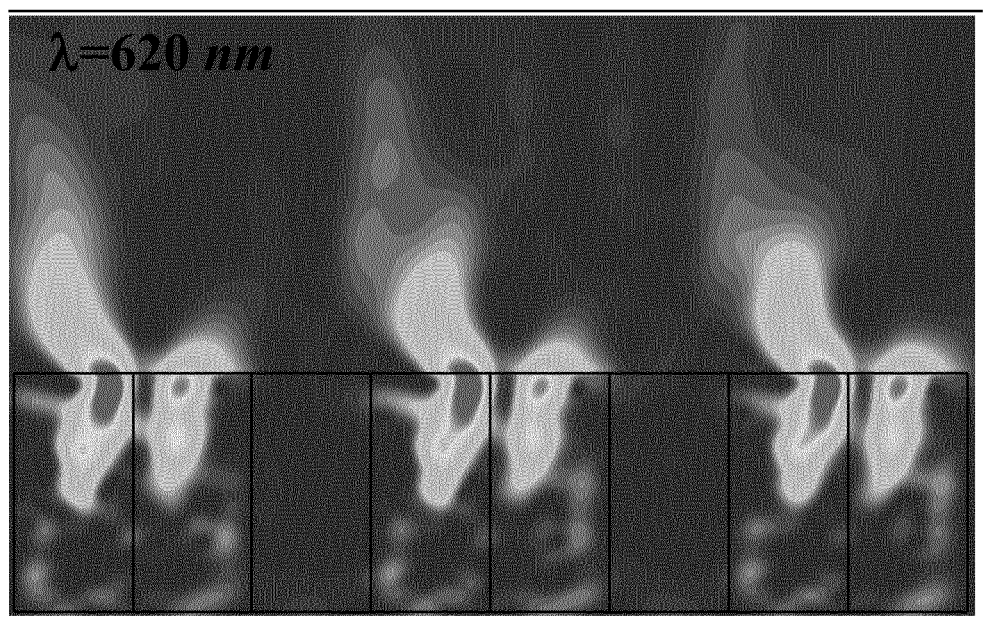
Figure 5F:
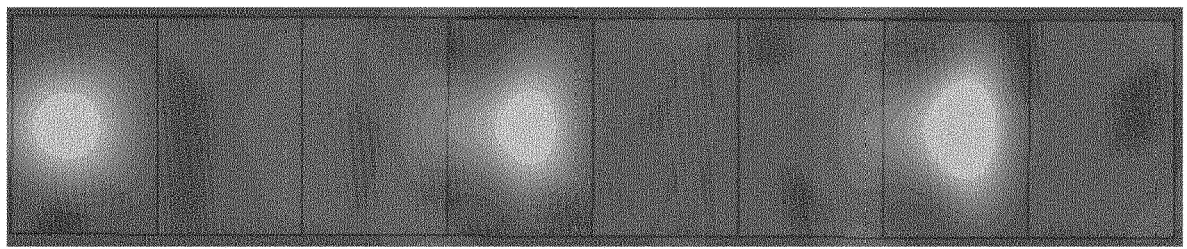

FIGS. 5(b), (d) and (f) present the power density distribution xy-plane (Z=1700 nm) for the array presented in FIG. 4(a) with such parameters: $n_1=1$, $n_2=1.8$, $n_3=1.6$, $W_1=W_2=W_3=600$ nm, $H=1200$ nm.

Figure 6A:
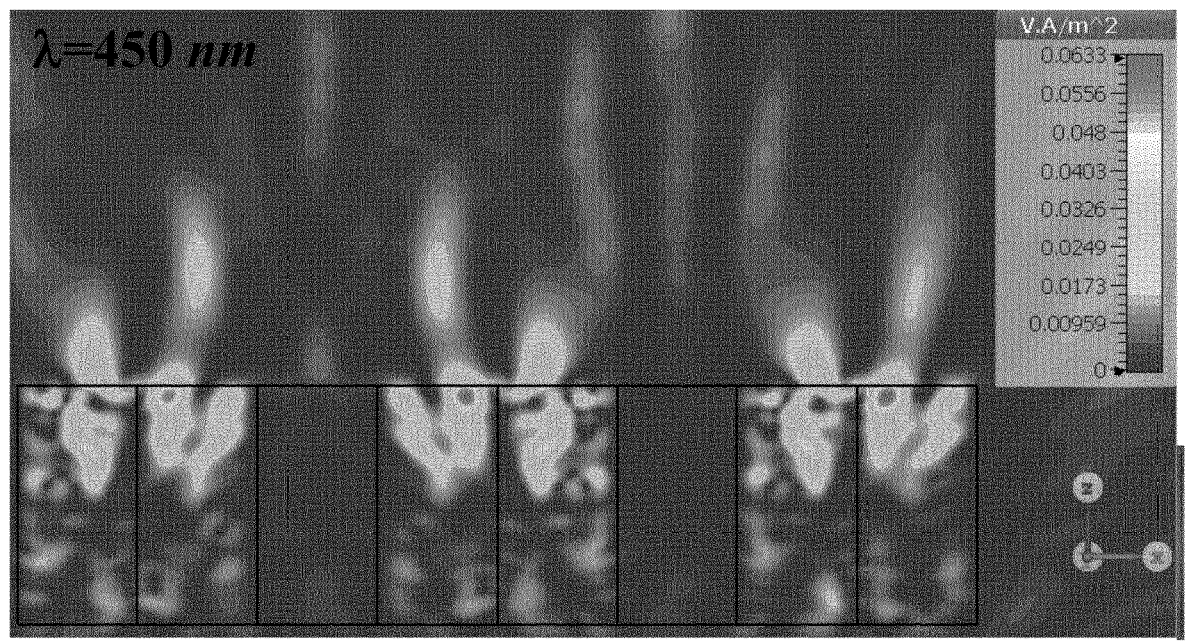

FIGS. 6(a), (c) and (e) present the power density distribution in a xz-plane (Y=0) for the array presented in FIG. 4(b) with such parameters: $n_1=1$, $n_2=1.8$, $n_3=1.6$, $W_1=W_2=W_3=600$ nm, $H=1200$ nm.

Figure 6B:
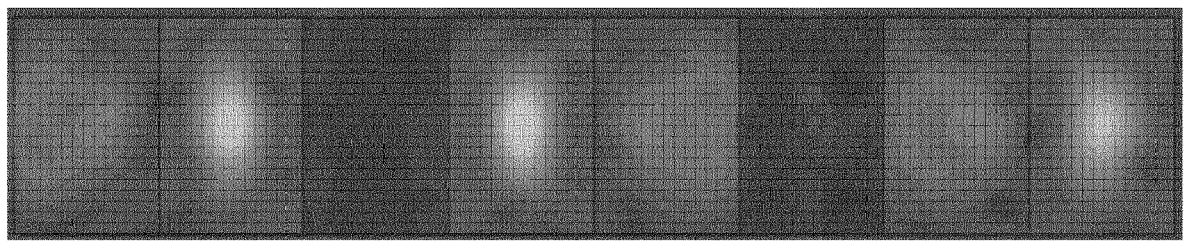
Figure 6C:
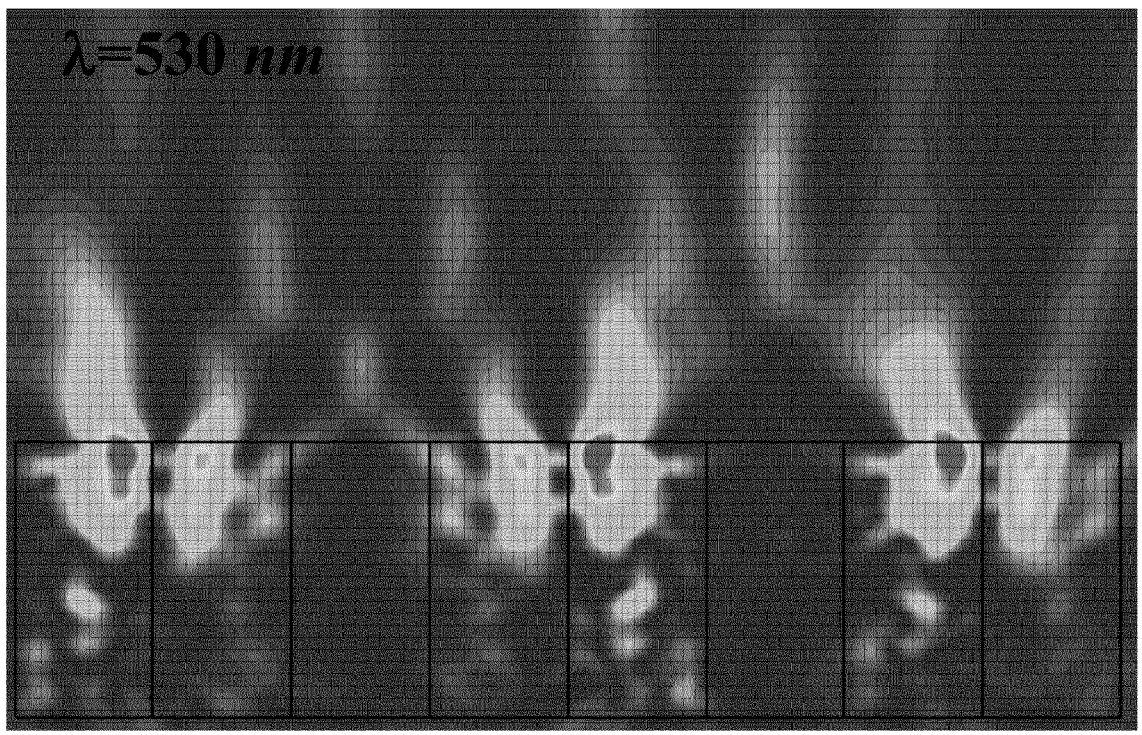
Figure 6D:
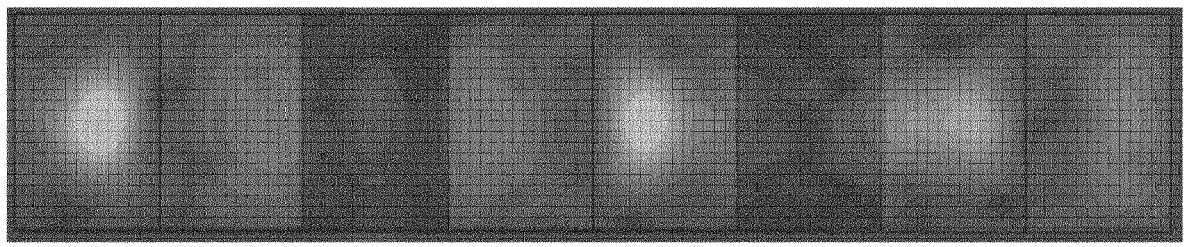
Figure 6E:
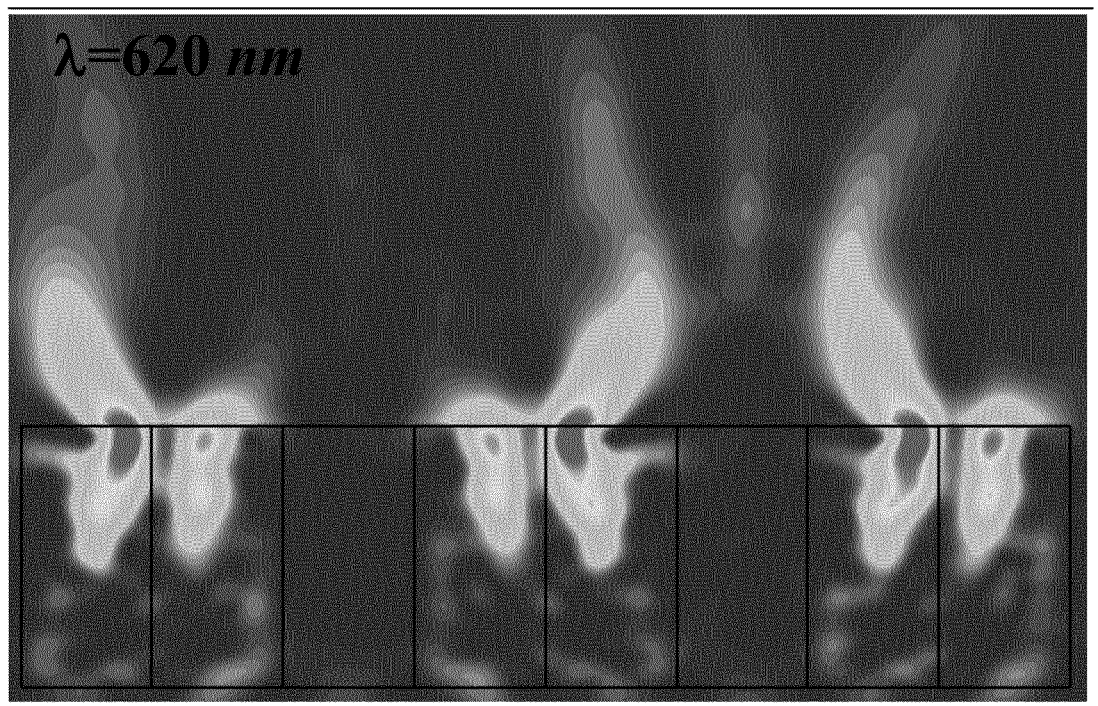
Figure 6F:
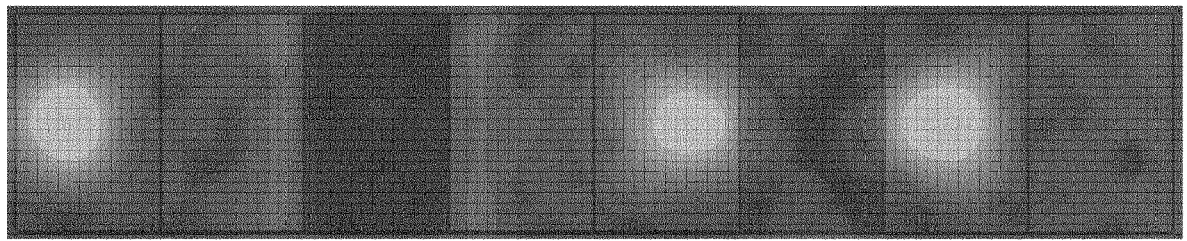

FIGS. 6(b), (d) and (f) present the power density distribution xy-plane (Z=1700 nm) for the array presented in FIG. 4(b) with such parameters: $n_1=1$, $n_2=1.8$, $n_3=1.6$, $W_1=W_2=W_3=600$ nm, $H=1200$ nm.

Hence, with the configuration described in FIGS. 6(a)-(f), we obtain a blue color splitting in the sense that the structure deviates the light associated with the wavelength 450 nm in one direction, and the other components in another direction.

Let us note that for double-material dielectric structure with $n_3 > \sqrt{n_1 n_2}$ the spots corresponding to the green and red colors are quite close. As it was mentioned before, changing the materials of the layers we can manage the position of the spots.

FIGS. 7(a)-(f) show the power density distribution in the xz- and xy-planes at wavelengths corresponding to the blue, green and red colors for a second periodic arrangement (FIG. 4(b)) of double-material dielectric structure with $n_3 < \sqrt{n_1 n_2}$. Placing the detector at the distance Z=1500 nm we can distinguish that now the spots corresponding to green color are close to the spots for blue one.

Figure 7A:
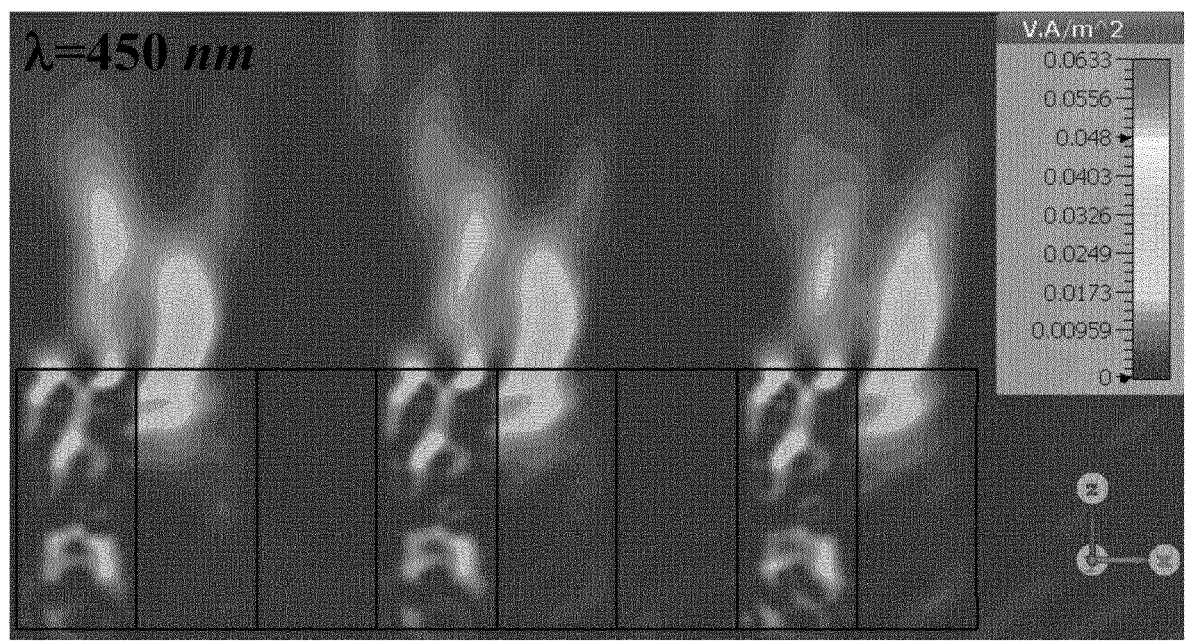

Indeed, FIGS. 7(a), (c) and (e) present the power density distribution in a xz-plane (Y=0) for the array presented in FIG. 4(a) with such parameters: $n_1=1$, $n_2=2$, $n_3=1.2$, $W_1=W_2=W_3=600$ nm, $H=1300$ nm.

Figure 7B:
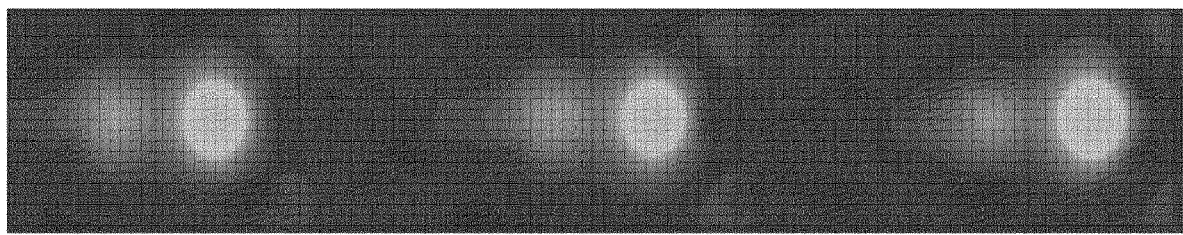
Figure 7C:
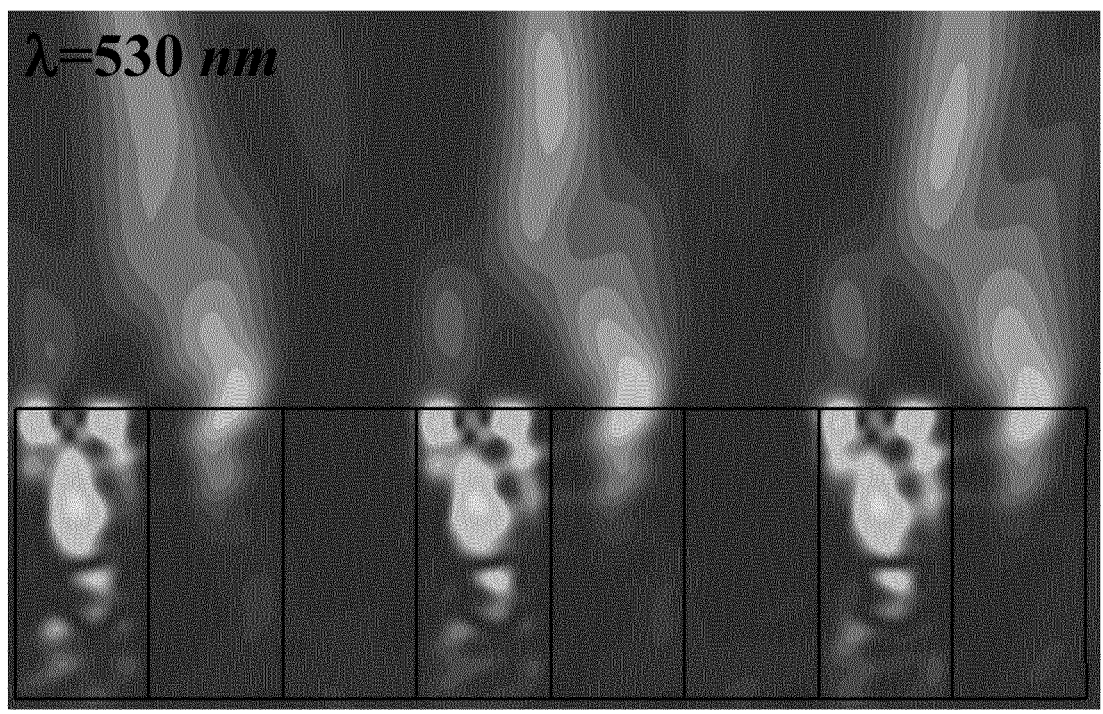
Figure 7D:
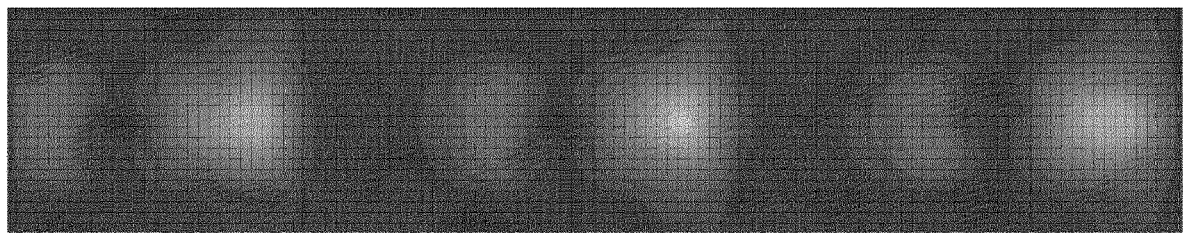
Figure 7E:
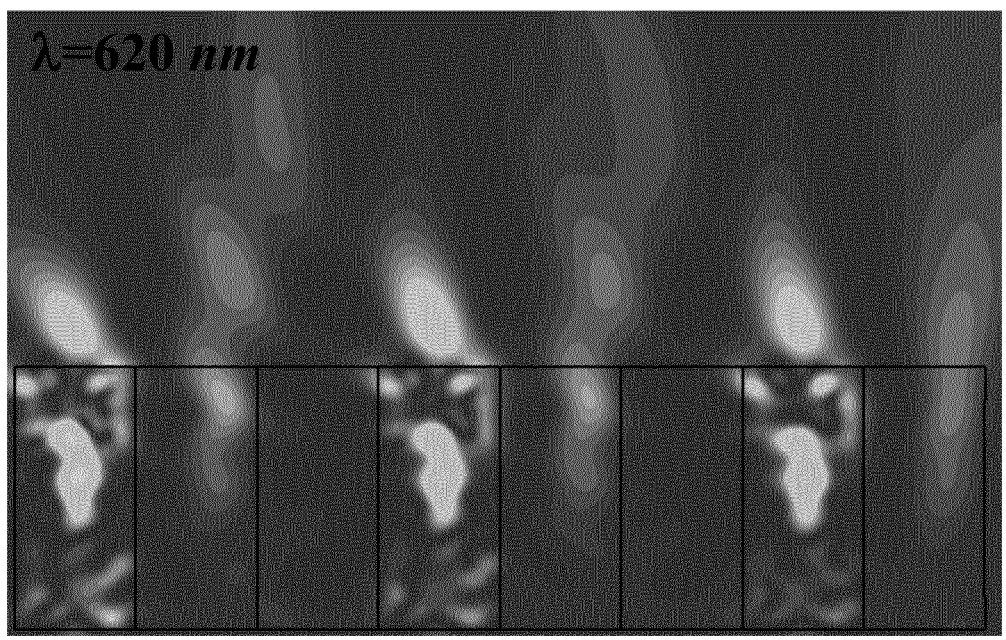
Figure 7F:
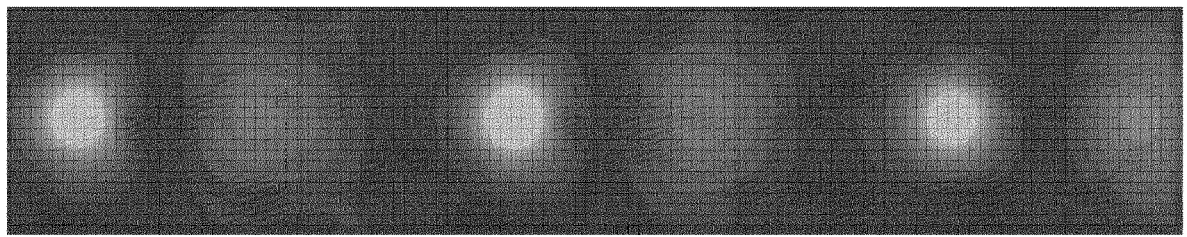

FIGS. 7(b), (d) and (f) present the power density distribution xy-plane (Z=1500 nm) for the array presented in FIG. 4(a) with such parameters: $n_1=1$, $n_2=2$, $n_3=1.2$, $W_1=W_2=W_3=600$ nm, $H=1300$ nm.

The neighbouring Nis more affect each other if we reduce the width $W_3$ (FIGS. 8(a)-(f) and FIGS. 9(a)-(f); $W_3=200$ nm). We can see that for both arrays of structures the positions of the spots corresponding to the different colors will be changed. As the result, at the distance Z=1700 nm we cannot easily distinguish the spots corresponding to the different colors. It is necessary to change the position of the detector. But for lower width $W_3$, first arrangement is preferable.

Figure 8A:
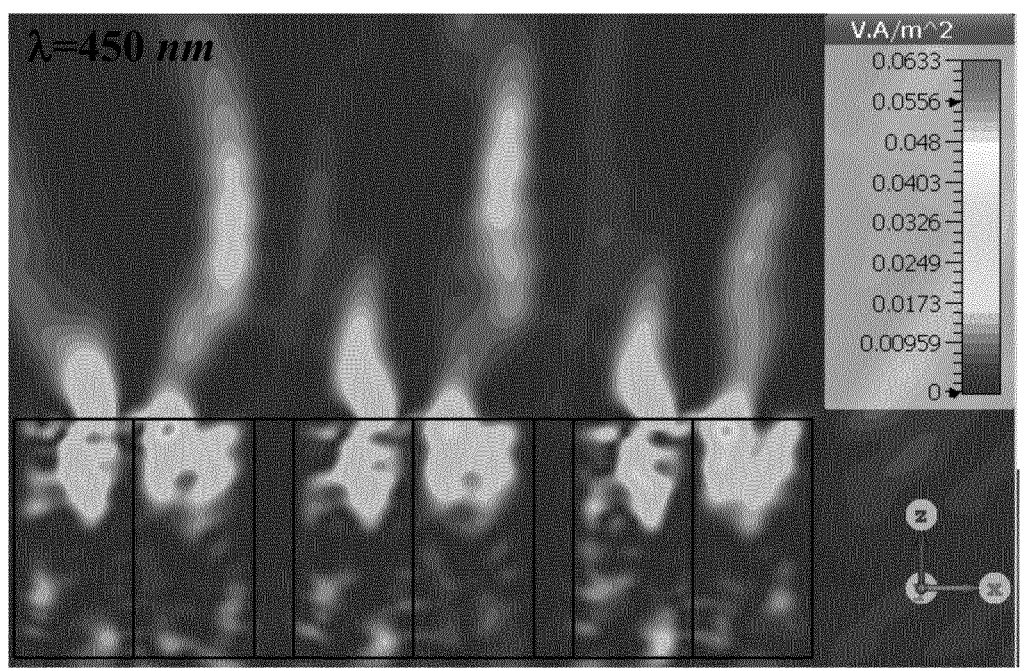

Indeed, FIGS. 8(a), (c) and (e) present the power density distribution in a xz-plane (Y=0) for the array presented in FIG. 4(a) with such parameters: $n_1=1$, $n_2=1.8$, $n_3=1.6$, $W_1=W_2=600$ nm and $W_3=200$ nm, $H=1200$ nm.

Figure 8B:
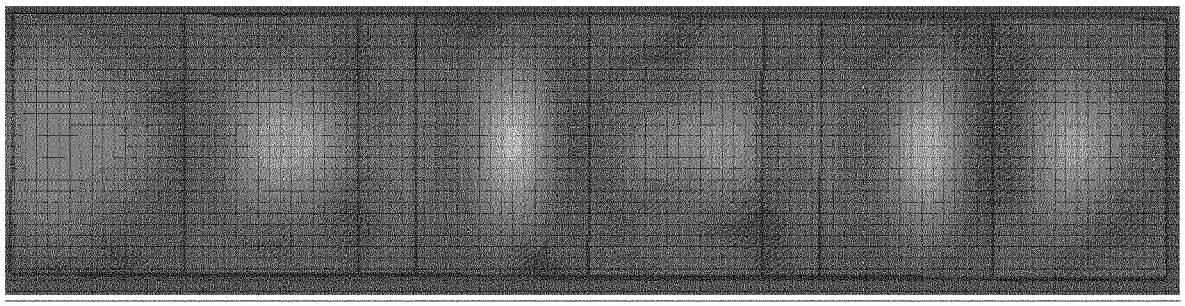
Figure 8C:
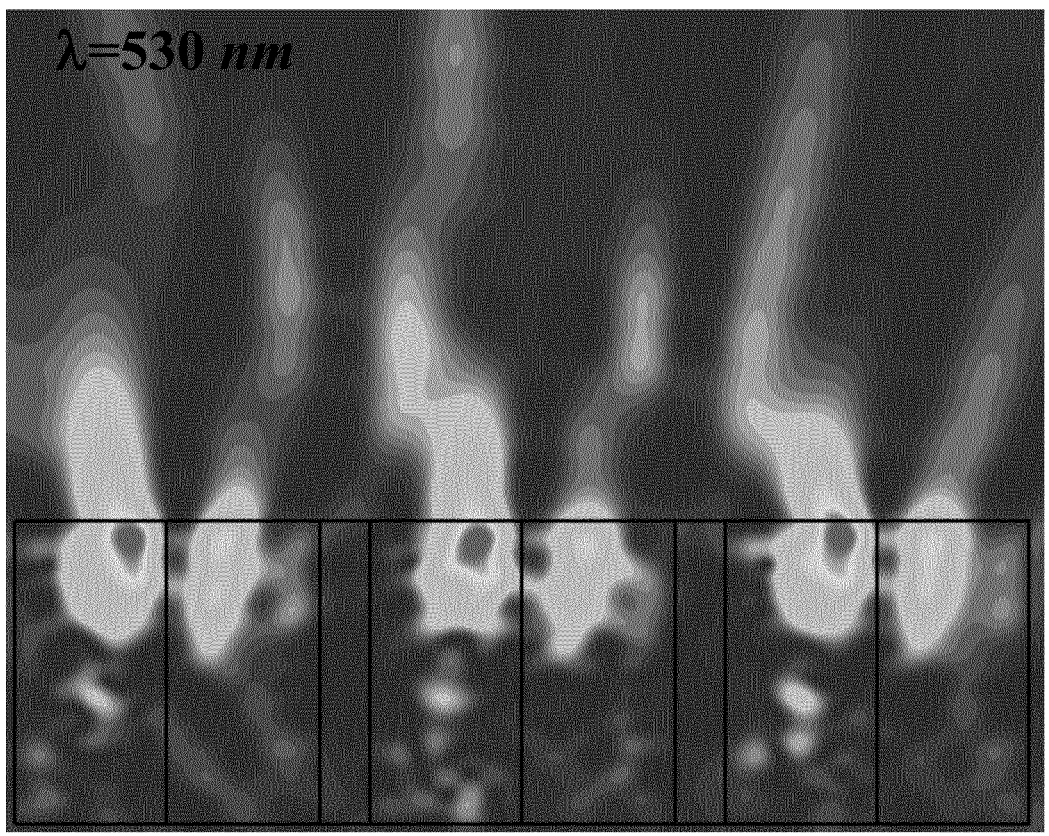
Figure 8D:
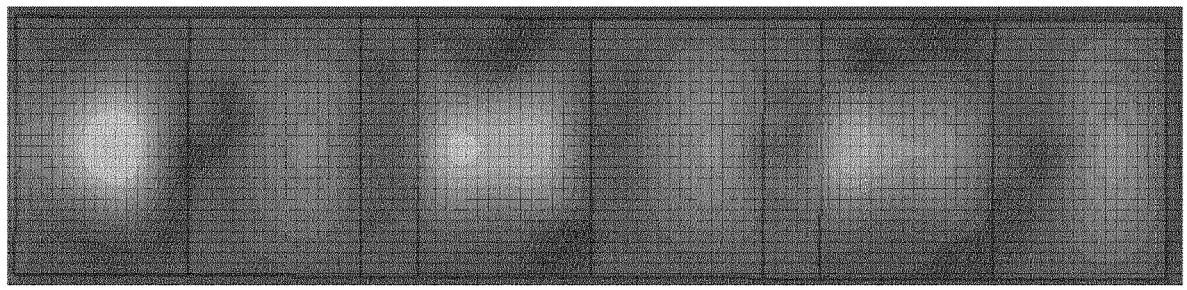
Figure 8E:
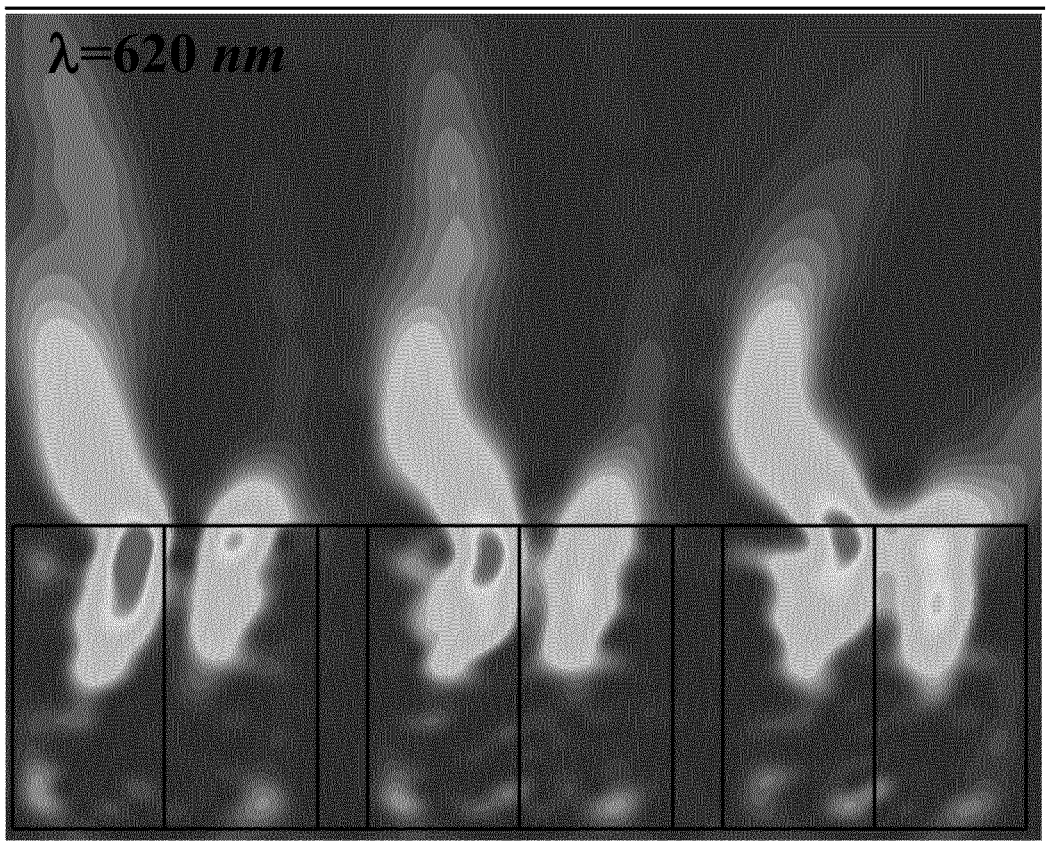
Figure 8F:
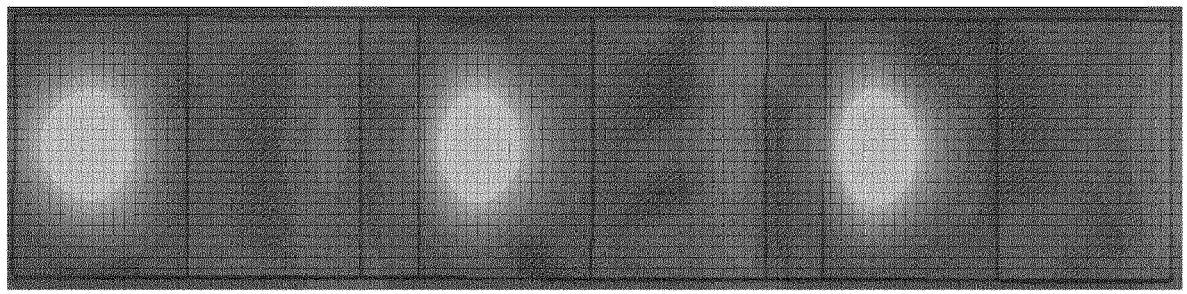

FIGS. 8(b), (d) and (f) present the power density distribution xy-plane (Z=1700 nm) for the array presented in FIG. 4(a) with such parameters: $n_1=1$, $n_2=1.8$, $n_3=1.6$, $W_1=W_2=600$ nm and $W_3=200$ nm, $H=1200$ nm.

Figure 9A:
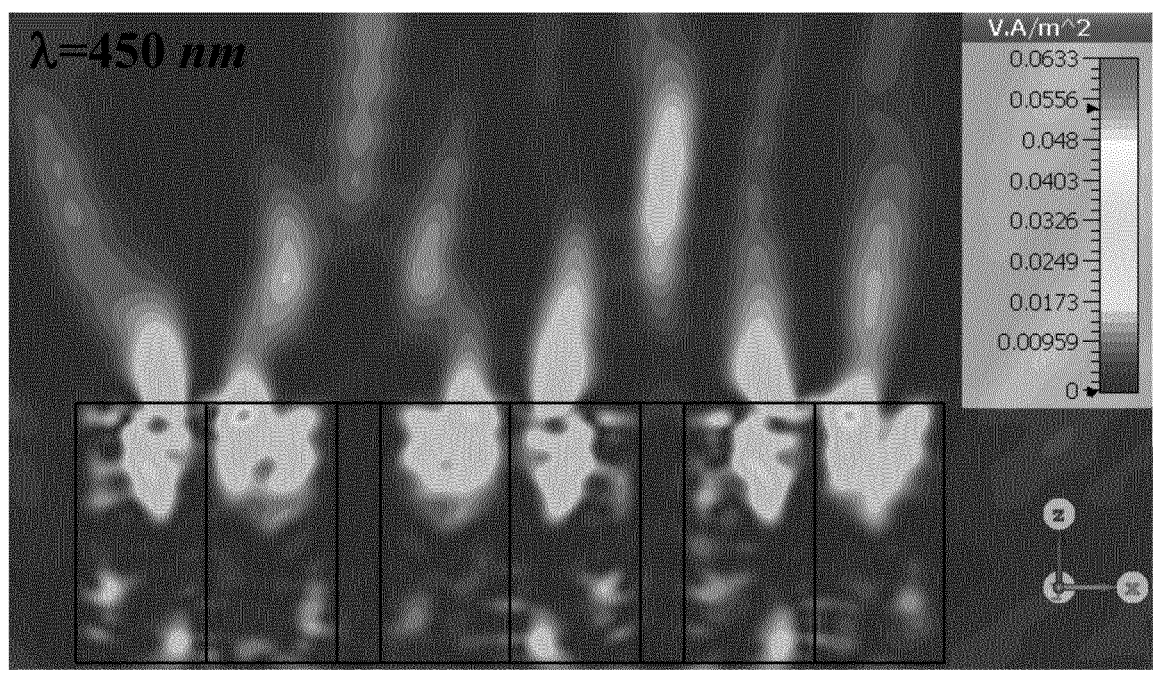

FIGS. 9(a), (c) and (e) present the power density distribution in a xz-plane (Y=0) for the array presented in FIG. 4(b) with such parameters: $n_1=1$, $n_2=1.8$, $n_3=1.6$, $W_1=W_2=600$ nm and $W_3=200$ nm, $H=1200$ nm.

Figure 9B:
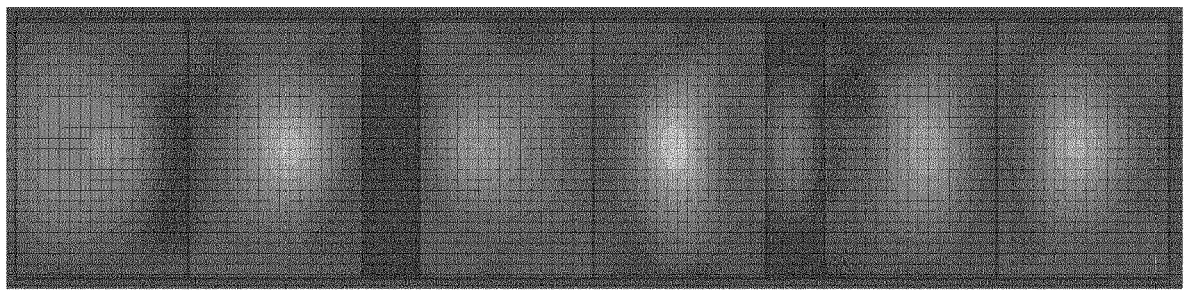
Figure 9C:
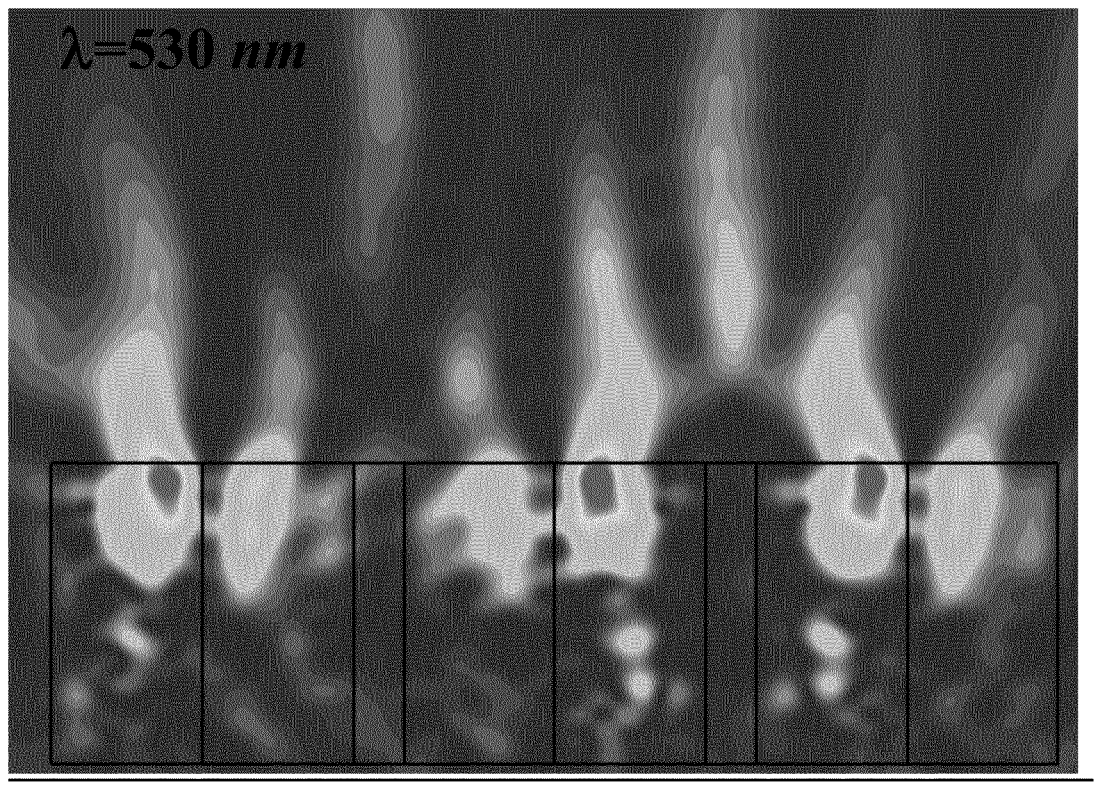
Figure 9D:
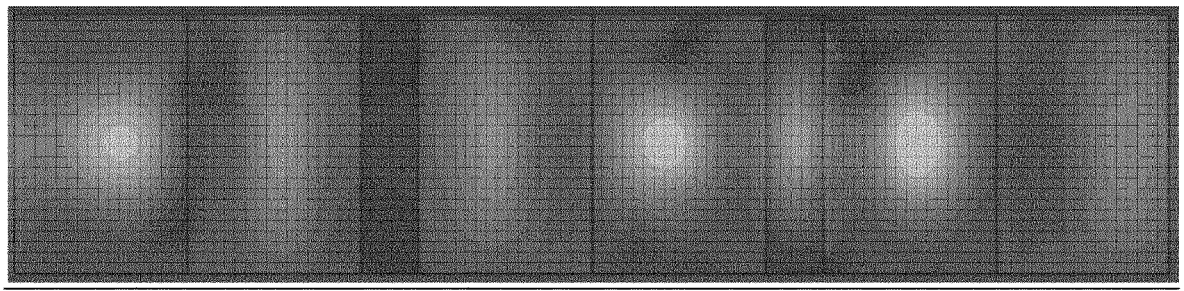
Figure 9E:
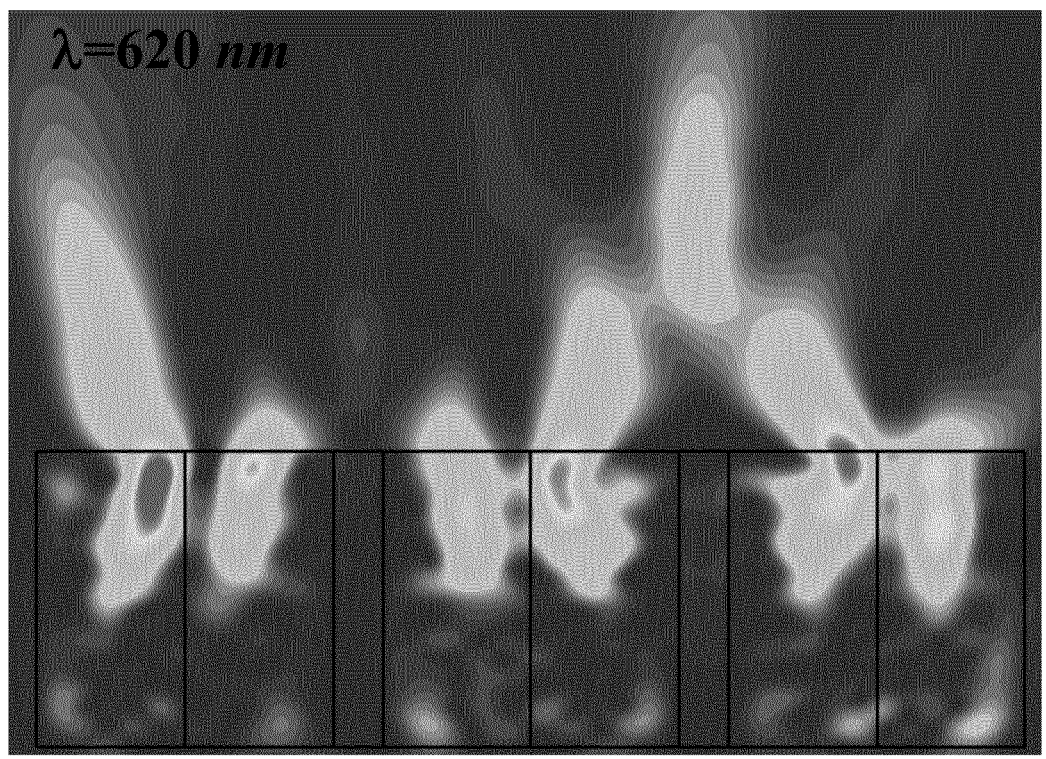
Figure 9F:
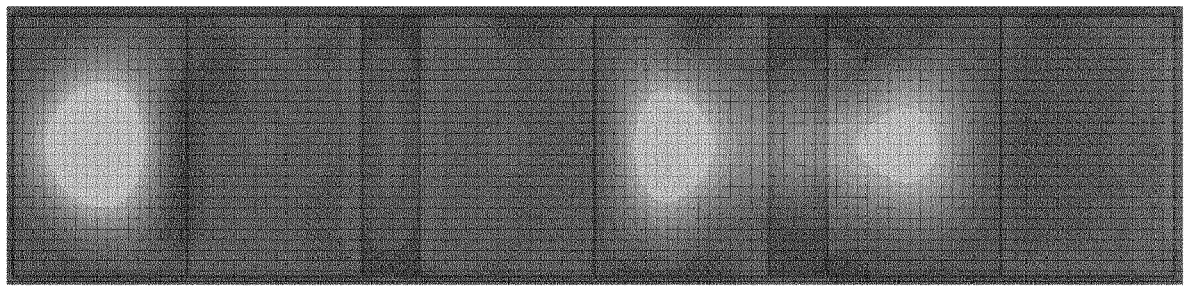

FIGS. 9(b), (d) and (f) present the power density distribution xy-plane (Z=1700 nm) for the array presented in FIG. 4(b) with such parameters: $n_1=1$, $n_2=1.8$, $n_3=1.6$, $W_1=W_2=600$ nm and $W_3=200$ nm, $H=1200$ nm.

To analyze the influence of the distance between the elements in the array on the color splitting phenomenon, we consider the dependence of peak power density and x-coordinate of the NJ hot spot on $W_3$ (FIGS. 10(a)-(b) to 13(a)-(b)). The presented numerical data correspond to the single central element in two different arrays (see FIGS. 4(a)-(b)) of three double-material elements. It was assumed that boundary between the constitutive parts of the element corresponds to X=0. For the array presented in FIG. 4(a) (periodic array), left part (X<0) is the part with higher refractive index $n_2$; for the array presented in FIG. 4(b) (medium with refractive index n1 separate the blocks with the same refractive indexes), left part is the part with lower refractive index $n_3$. Almost in all considered cases we can observe 2 NJ hot spots of different power density above the constitutive parts of the elements. As the result of analysis of these Figures we can conclude that for the fixed wavelength the position of the hot spot is almost independent on the distance $W_3$. At the same time, for a small distance $W_3$ we can have power density redistribution affecting color separation.

Indeed, FIG. 10 present a peak power density (a) and X-coordinate of NJ hot spot (b) versus W3 for the single (central) element of the array presented in FIG. 4(a) with such parameters $n_1=1$, $n_2=1.8$, $n_3=1.6$, $W_1=W_2=600$ nm, H=1200 nm, Z=1700 nm.

FIG. 11 present a peak power density (a) and X-coordinate of NJ hot spot (b) versus W3 for the single (central) element of the array presented in FIG. 4(b) with such parameters $n_1=1$, $n_2=1.8$, $n_3=1.6$, $W_1=W_2=600$ nm, H=1200 nm, Z=1700 nm.

FIG. 12 present a peak power density (a) and X-coordinate of NJ hot spot (b) versus W3 for the single (central) element of the array presented in FIG. 4(a) with such parameters $n_1=1$, $n_2=2$, $n_3=1.2$, $W_1=W_2=600$ nm, H=1300 nm, Z=1500 nm.

FIG. 13 present a peak power density (a) and X-coordinate of NJ hot spot (b) versus W3 for the single (central) element of the array presented in FIG. 4(b) with such parameters $n_1=1$, $n_2=2$, $n_3=1.2$, $W_1=W_2=600$ nm, H=1300 nm, Z=1500 nm.

5.2.4 Arrays of Structures, Impact of Illumination Conditions

NJ field distribution dramatically changes with the angle of wave incidence. Let us consider the possibility to use double material dielectric structures for color splitting in the case of oblique incidence. It was observed that for oblique incidence, we have additional deviation of the NJs related to the edges of the system. So, the position of point B will be changed. The dispersion of NJ response and mutual influence of the neighbouring NJs will lead to the shift of the spots corresponding to the different colors and totally new redistribution of the power density. FIGS. 14(a)-(f) and 15(a)-(f) show the power density distribution in xz- and xy-for 1D arrays of NJ-based dielectric color splitters presented in FIG. 4(b) and $\Theta_i=\pm15°$. We can distinguish intensive spots corresponding to the blue and red colors above different structures for the detector at Z=1400 nm. The periodic arrays (FIG. 4(a)) does not provide color splitting function.

Figure 14A:
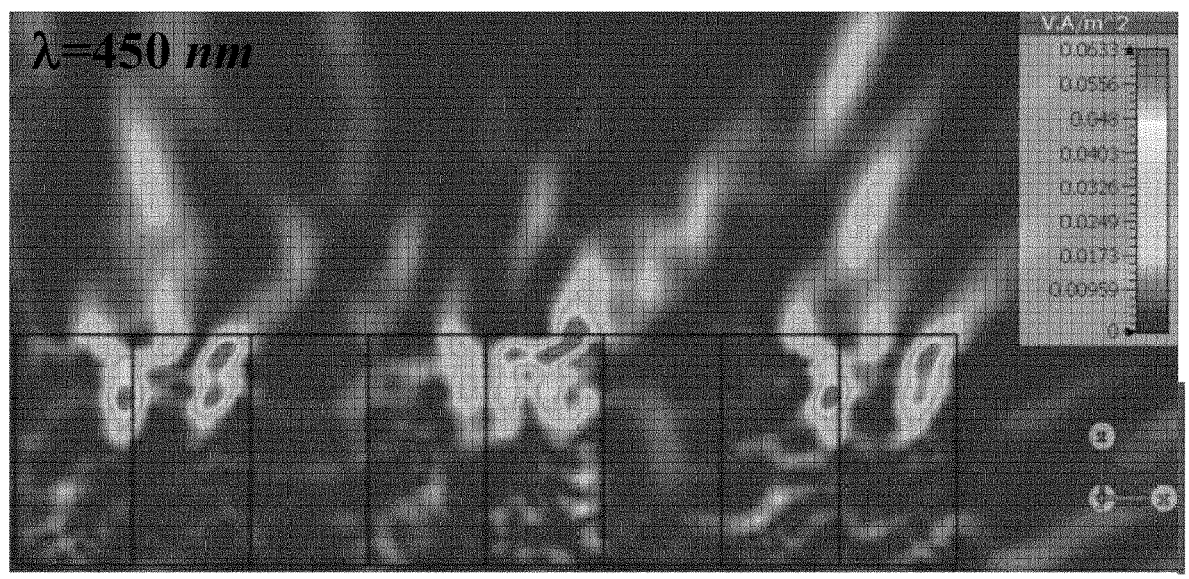

FIGS. 14(a), (c) and (e) present the power density distribution in a xz-plane (Y=0) for the array presented in FIG. 4(b) with such parameters: $n_1=1$, $n_2=1.8$, $n_3=1.6$, $W_1=W_2=W_3=600$ nm, H=1180 nm and $\Theta_i=15°$.

Figure 14B:
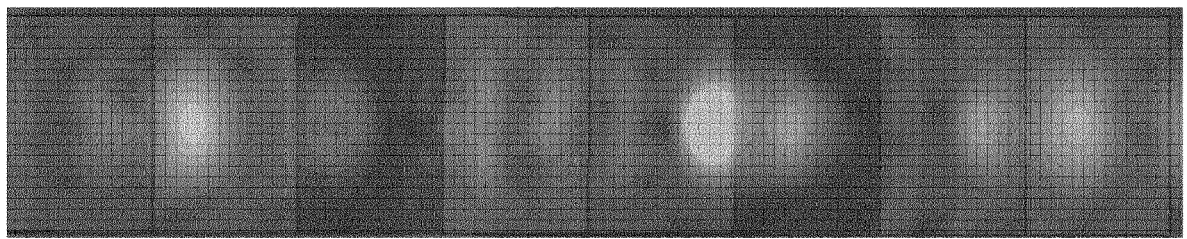
Figure 14C:
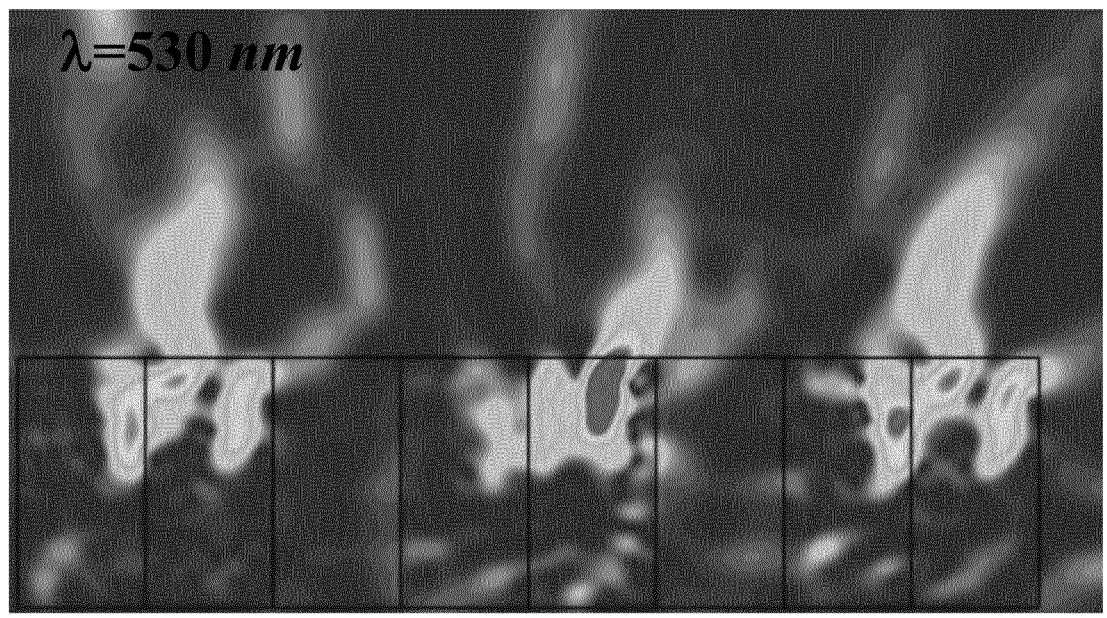
Figure 14D:
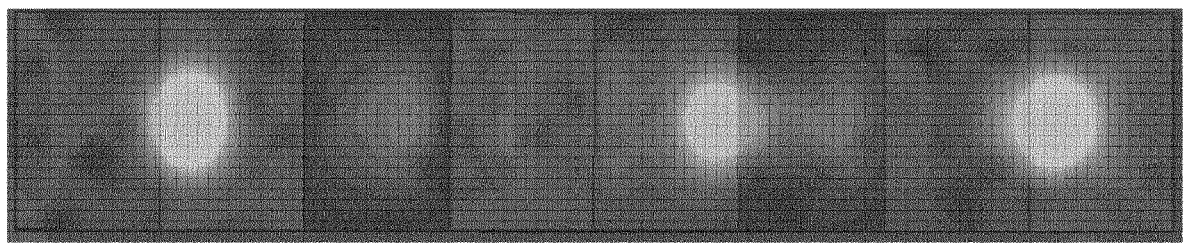
Figure 14E:
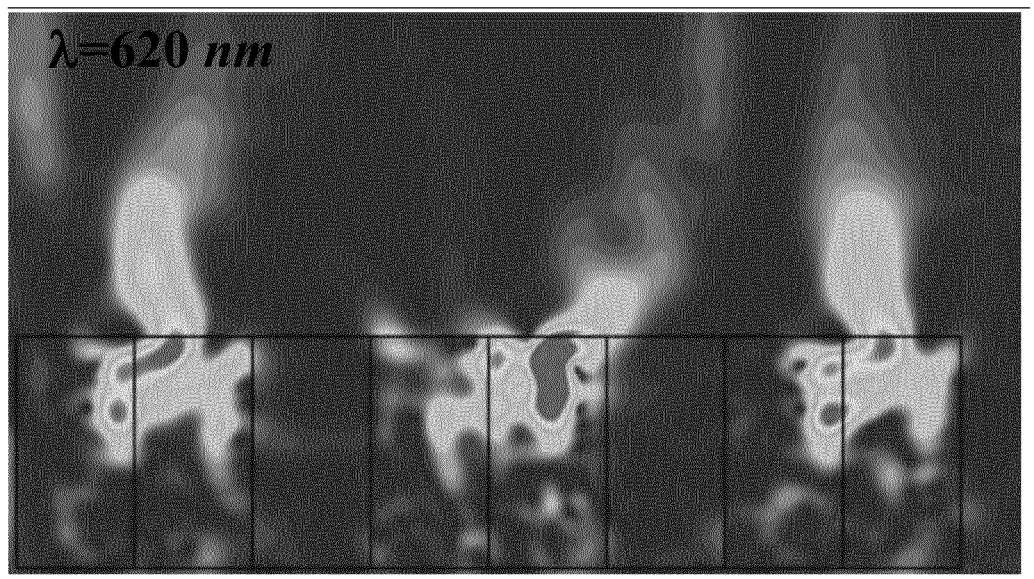
Figure 14F:
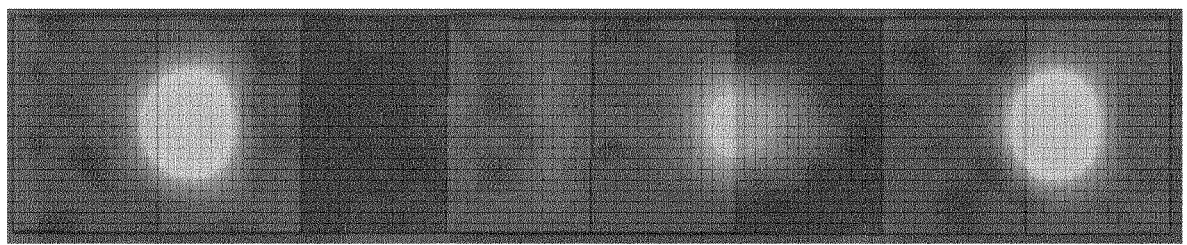

FIGS. 14(b), (d) and (f) present the power density distribution xy-plane (Z=1400 nm) for the array presented in FIG. 4(b) with such parameters: $n_1=1$, $n_2=1.8$, $n_3=1.6$, $W_1=W_2=W_3=600$ nm, H=1180 nm and $\Theta_i=15°$.

Figure 15A:
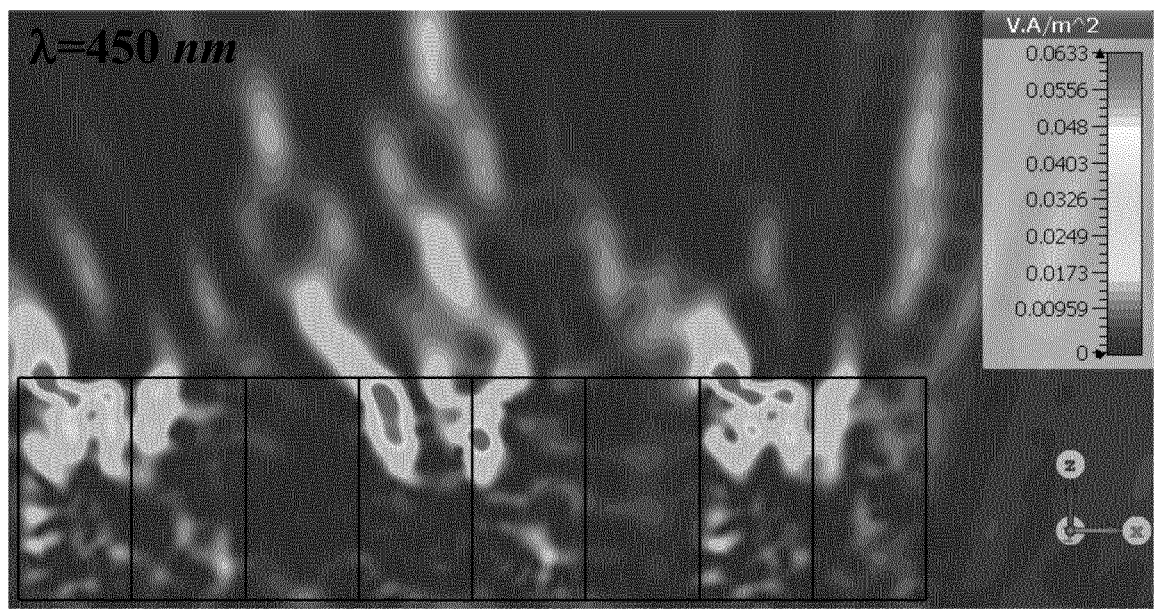

FIGS. 15(a), (c) and (e) present the power density distribution in a xz-plane (Y=0) for the array presented in FIG. 4(b) with such parameters: $n_1=1$, $n_2=1.8$, $n_3=1.6$, $W_1=W_2=W_3=600$ nm, H=1180 nm and $\Theta_i=15°$.

Figure 15B:
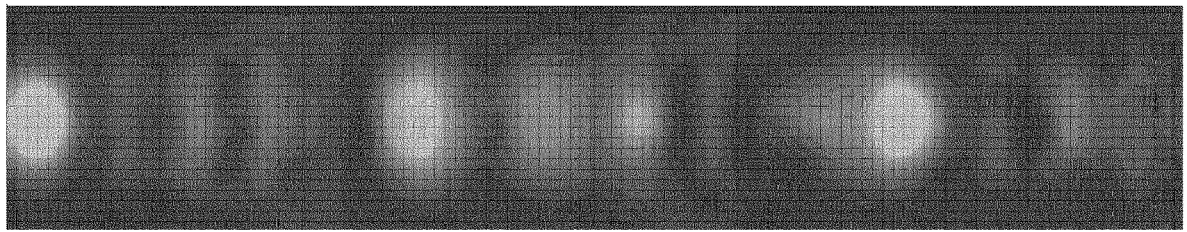
Figure 15C:
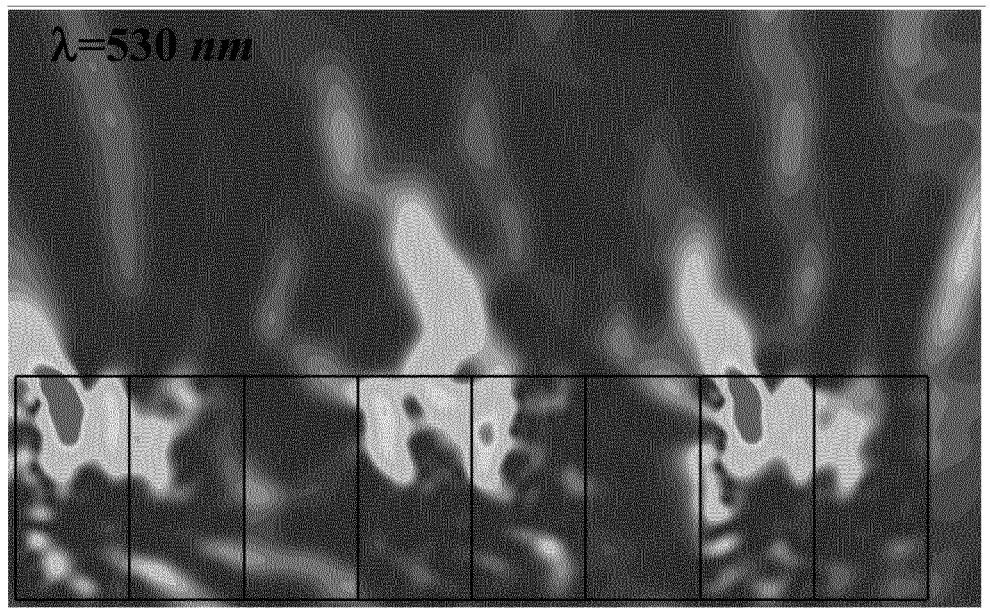
Figure 15D:
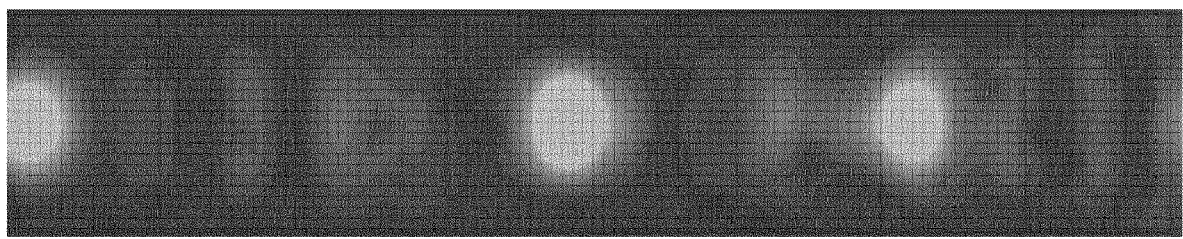
Figure 15E:
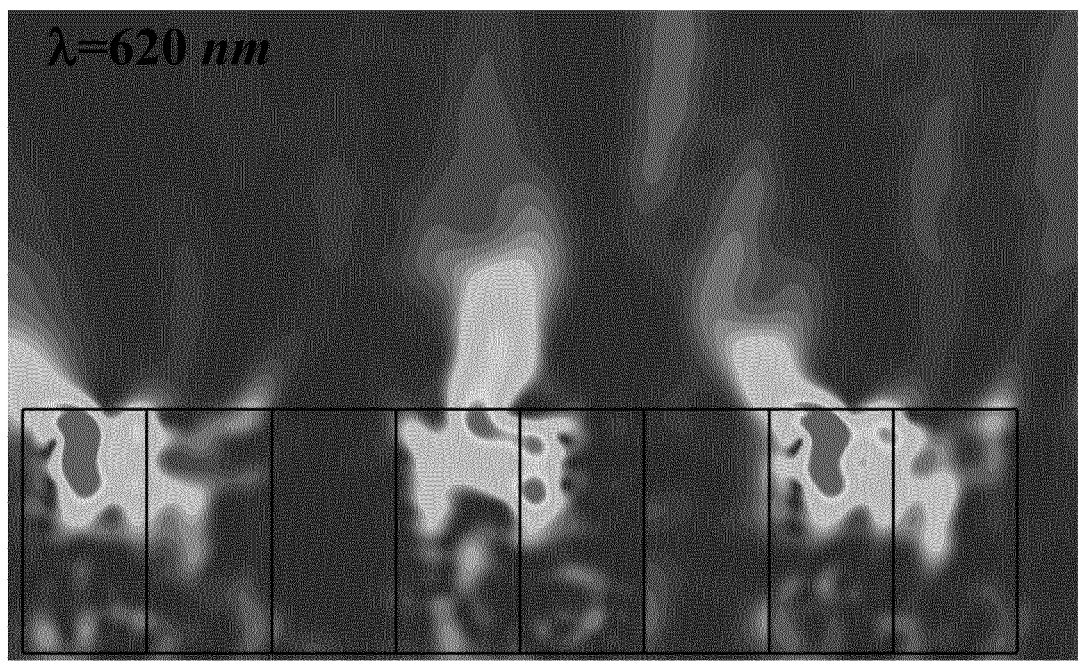
Figure 15F:
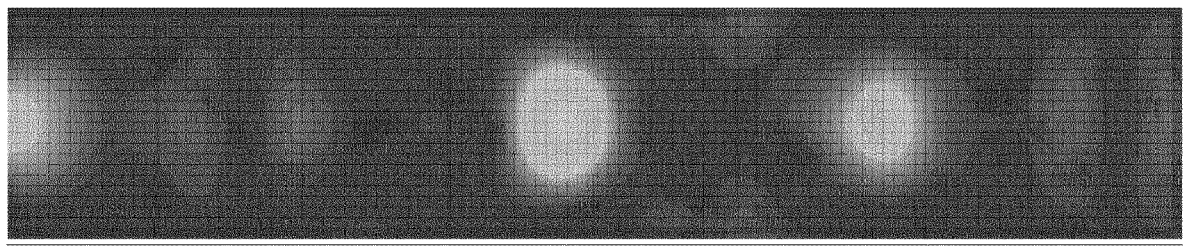

FIGS. 15(b), (d) and (f) present the power density distribution xy-plane (Z=1700 nm) for the array presented in FIG. 4(b) with such parameters: $n_1=1$, $n_2=1.8$, $n_3=1.6$, $W_1=W_2=W_3=600$ nm, H=1180 nm and $\Theta_i=15°$.

Figure 16A:
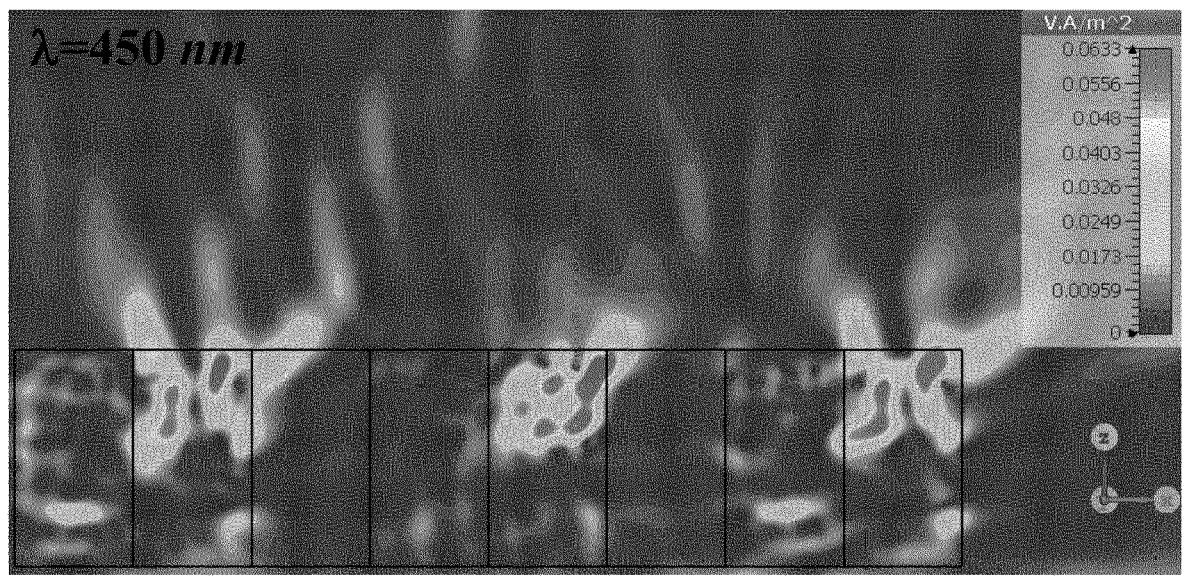

Increasing the angle of electromagnetic wave incidence (FIGS. 16(a), (c) and (e), with $\Theta_i=\pm30°$), we still can obtain desirable optical function. In this case the distance between the intensive spots corresponding to the blue and red colors will be small.

FIGS. 16(a), (c) and (e) present the power density distribution in a xz-plane (Y=0) for the array presented in FIG. 4(b) with such parameters: $n_1=1$, $n_2=1.8$, $n_3=1.6$, $W_1=W_2=W_3=600$ nm, H=1100 nm and $\Theta_i=30°$.

Figure 16B:
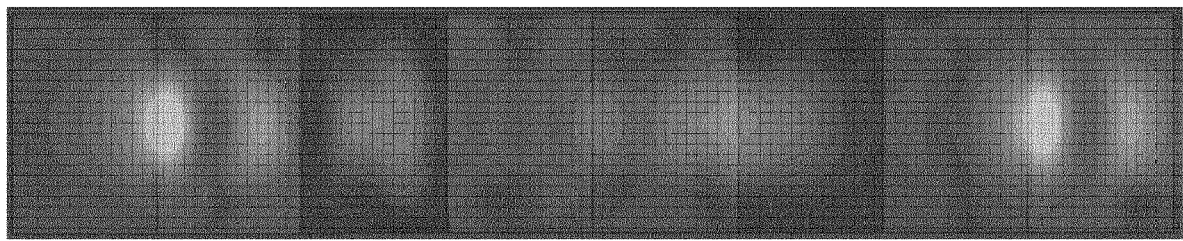
Figure 16C:
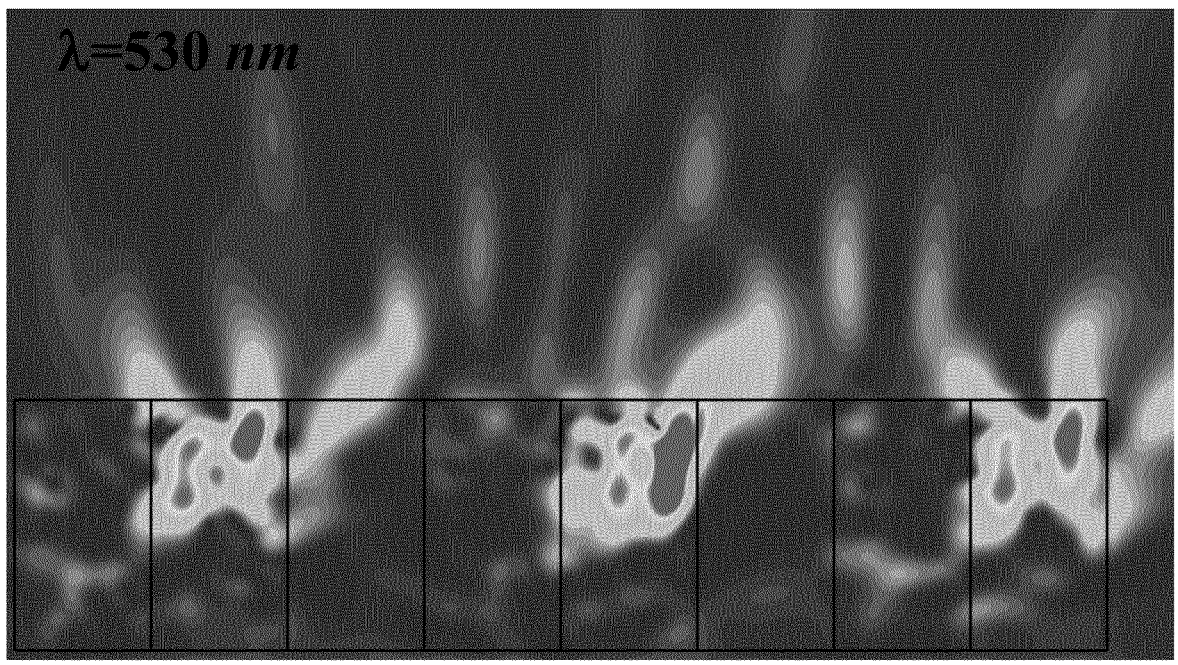
Figure 16D:
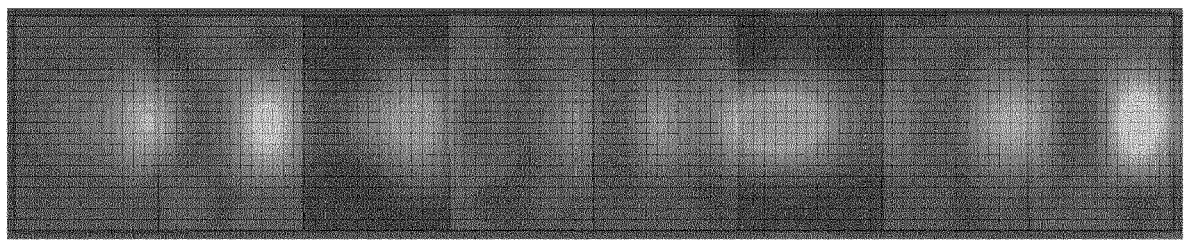
Figure 16E:
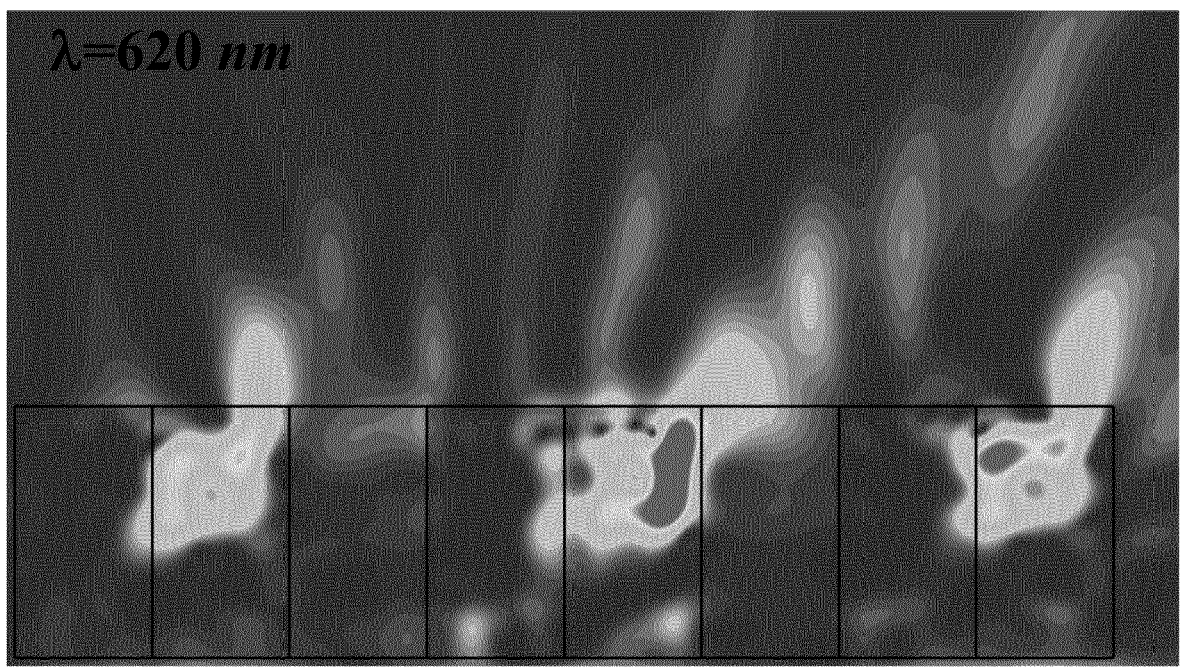
Figure 16F:
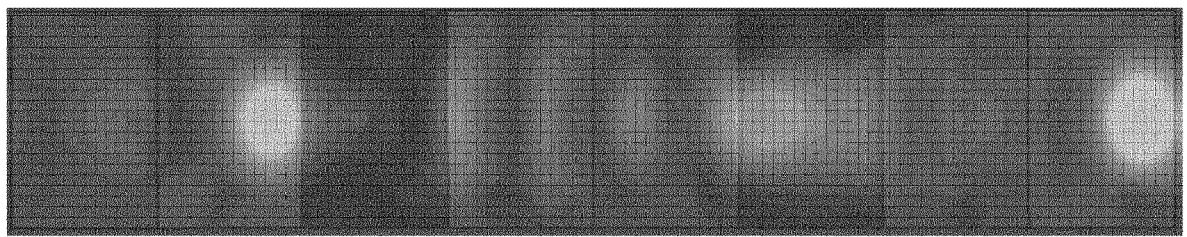

FIGS. 16(b), (d) and (f) present the power density distribution xy-plane (Z=1300 nm) for the array presented in FIG. 4(b) with such parameters: $n_1=1$, $n_2=1.8$, $n_3=1.6$, $W_1=W_2=W_3=600$ nm, H=1100 nm and $\Theta_i=30°$.

5.2.5 2D Arrangement of the Color Splitters

In this section, we propose one embodiment that uses the designs in the previous section (5.2.4) to realize a full 2D arrangement of the color splitter elements on top of the image sensor pixels. FIGS. 17(a) and 17(b) illustrate the splitting effect of the color splitter microstructures from FIGS. 5(a)-(f) and FIGS. 6(a)-(f). FIG. 17(a) shows the case where the green (λ=530 nm) and red (λ=620 nm) wavelengths are deflected to one direction and the blue wavelength (λ=450 nm) to the opposite direction. We name the color splitting result of this splitter structure as "blue separation". FIG. 17(b) shows the case where the green (A=530 nm) and blue (λ=450 nm) wavelengths are deflected to one direction and the red wavelength (λ=620 nm) to the opposite direction. We name the color splitting result of this splitter structure as "red separation".

FIG. 17(a) presents a blue separation, as the result of a color splitter design demonstrated in FIGS. 5(a)-(f).

FIG. 17(b) presents a red separation, as the result of a color splitter design demonstrated in FIGS. 7(a)-(f).

FIG. 18 presents an embodiment showing the 2D arrangement of the splitter elements on top of the regular 2D grid of the image sensor pixels, together with a suggested demosaicing function.

This embodiment uses the two types of color splitter structures shown FIGS. 17(a) and 17(b), one tailored for the "blue separation" and the other one tailored for the "red separation" functionality. FIG. 18 also illustrates the light components received by each pixel on the image sensor together with a suggested demosaicing function.

FIG. 19 presents an embodiment where a color splitter structure as previously presented partially covers at least two pixels.

It is possible to design a color splitter structure that can "deviate" electromagnetic waves with a specific wavelength $\lambda_1$ and that can deviate in another direction light having a spectrum in which no or few electromagnetic waves having a wavelength equal to $\lambda_1$ are present. Hence, each pixel (between pixel 1 and pixel 2) record a different value, for different colors. In a variant, a conventional color filter is added at the top of the photosensitive material in order to filter residual electromagnetic waves.

5.2.6 Modification of the Base Angle of the Structure with Dual Materials

FIG. 20 provides a cross-section view of a double-material structure with nonvertical edges.

In this subsection, we consider the structures with non-vertical edges and top/bottom surface parallel to xy-plane. Let us assume that $\alpha_i$ (with i equals to 1, 2 or 3) are the base angles for a double-material system. The general topology of the double-material NJ structure is illustrated in FIG. 20. This cross-section view may correspond to the double-material prismatic system embedded in a homogeneous dielectric host media with a refractive index $n_1<n_2<n_3$.

For the structure with the base angles $\alpha_i$ (with i equals to 1, 2 or 3) the NJ beam radiation angle $\Theta_{Bj}$ can be determined using the approximate formula (08):

$$\Theta_{Bj} \approx \frac{90° - \Theta'_{TIRj}}{2}. \quad (08)$$

Here $\Theta'_{TIRj}$ are the critical angles of refraction from the nonvertical edges. To get the approximate formula for $\Theta'_{TIRj}$ we should just take into account the changing of the position of the edge. As the result, the NJ beam radiation angle can be estimated as:

$$\Theta_{Bj} \approx 90° - \frac{\Theta_{TIRj} + \alpha_j}{2}. \quad (09)$$

To explain the behavior of total NJs radiated by the double-material structure 10 we should substitute these expressions for NJ radiation angles into the formulas (04)-(07).

In the case of the system with nonvertical edges the main performance characteristics of the double-material system discussed before are preserved.

The change of the base angle will change the direction of the NJs and so it affects the crossing points of the nanojet and the color splitting effect. The design rule for a color splitter with non-vertical base angle is to calculate the new NJ deviation angles, and the calculate the height $H_B$ in which the crossing of the NJs happen and then choose H equal to $H_B$ to acheive the color splitting effect.

More precisely, to explain the behavior of total NJs radiated by the double-material structure we should substitute new expressions for NJ radiation angles into the formulas (4)-(7). This will give us the coordinates of the cross sections of the NJ beams (points A, B and C in FIG. 1). We use the same design rule to get color separation property for the case of the double material element with non-vertical base angles: the spectral-dependent NJ beam deflection (the color splitting functionality) takes place if H≈$H_B$ and focal point B for the NJs related to the external boundaries of the system (NJ1 and NJ3) is close to the surface of microlens or within the system. The only difference will be that the value for $H_B$ is calculated using the modified formula (Eq. 09) for the NJ beam angles.

The invention claimed is:

1. An optical component comprising a color splitter structure associated with a three-dimensional cartesian coordinate system defined by axis x, y and z, the color splitter structure comprising a first part and a second part, that are positioned side by side along said x-axis, and each of said first and second parts being adjacent to a dielectric part along said x-axis, each of said dielectric parts having a first refractive index $n_1$, said first part having a second refractive index $n_2$, and said second part having a third refractive index $n_3$, wherein $n_1 < n_3 < n_2$, and wherein according to a cross section with a plane xz, the first part of said color splitter structure has a first width $W_1$ along the x-axis, a height H along the z-axis and the second part of said color splitter structure has a second width $W_2$ along the x-axis, and the same height H along the z-axis, and wherein said color splitter structure further comprises, according to said cross-section:
   a first edge between one of said dielectric parts and said first part of said color splitter structure along said z-axis that can generate a first beam (NJ1) in a near field zone;
   a second edge between said first part of said color splitter structure and said second part of said color splitter structure along said z-axis that can generate a second beam (NJ2) in a near field zone;
   a third edge between said second part of said color splitter structure and one of said dielectric parts along said z-axis that can generate a third beam (NJ3) in a near field zone,
   wherein said height H is substantially equal to a value $$H_B = \frac{W_1 + W_2}{\tan\Theta_{B1} + \tan\Theta_{B3}},$$

where $\Theta_{B1}$ and $\Theta_{B3}$ are respectively radiation angles of said first and said third beams.

2. The optical component according to claim 1, wherein said first width $W_1$ and said second width $W_2$ are substantially equal to each other.

3. The optical component according to claim 1, wherein said height H is around ±5% of the value $H_B$.

4. The optical component according to claim 1, wherein said radiation angles of said first and said third beams $\Theta_{B1}$ and $\Theta_{B3}$ are equal to $$90° - \frac{\Theta_{TIRj} + \alpha_j}{2},$$

where angles $\alpha_j$, with j equals to 1 or 3, are the base angles for said first and third edges, and $\Theta_{TIRj}$, with j equals to 1 or 3, are critical angles of refraction associated with respectively said first and third edges.

5. The optical component of claim 1 further comprising at least two pixels of an image sensor partially covered by the color splitter structure.

6. The optical component according to claim 5, wherein $n_3 > \sqrt{n_1 n_2}$ and a width W of said color splitter structure, equal to $W_1 + W_2$, is greater than 390 nm, and said one of said at least two pixels that records light associated with said first wavelength $\lambda_1$ is located at the normal of said first part of said color splitter structure, in the case said first wavelength $\lambda_1$ belongs to the range [620 nm, 700 nm] of visible light.

7. The optical component according to claim 5, wherein $n_3 > \sqrt{n_1 n_2}$ and a width W of said color splitter structure, equal to $W_1 + W_2$, is greater than 390 nm, and said one of said at least two pixels that records light associated with said first wavelength $\lambda_1$ is located at the normal of said second part of said color splitter structure, in the case said first wavelength $\lambda_1$ belongs to the range [390 nm, 450 nm] of visible light.

8. The optical component according to claim 5, wherein $n_3 < \sqrt{n_1 n_2}$ and a width W of said color splitter structure, equal to $W_1 + W_2$, is greater than 390 nm, and said one of said at least two pixels that records light associated with a first wavelength $\lambda_1$ is located at the normal of said second part of said color splitter structure, in the case said first wavelength $\lambda_1$ belongs to the range [620 nm, 700 nm] of visible light.

9. The optical component according to claim 5, wherein $n_3 < \sqrt{n_1 n_2}$ and a width W of said color splitter structure, equal to $W_1 + W_2$, is greater than 390 nm, and said one of said at least two pixels that records light associated with a first wavelength $\lambda_1$ is located at the normal of said first part of said color splitter structure, in the case said first wavelength $\lambda_1$ belongs to the range [390 nm, 450 nm] of visible light.

10. The optical component according to claim 5, wherein the optical component comprises a plurality of pairs of pixels, where each pair of pixels is partially covered by a structure identical to said color splitter structure.

11. The optical component according to claim 10, wherein each successive structure is separated by an identical dielectric part having a width, along the x-axis, equal to $W_3$, and wherein the value of $W_3$ is comprised between 250 nm and 600 nm.

12. The optical component according to claim 5, wherein the optical component comprises a plurality of pairs of pixels, where each pair of pixels is partially covered by a structure that is alternatively either a structure identical to said color splitter structure, or a structure comprising first and second parts which are inverted compared to said color splitter structure.

13. The optical component according to claim 5, wherein at least one pixel of said at least two pixels further comprises conventional color filter positioned between said color splitter structure and photosensitive materials associated with each of said at least two pixels.

14. The optical component of claim 5, wherein one of said pixels records light in a first color component and another of said pixels records light in a second color component different from the first color component.

15. An optical component having a plurality of color splitters, each color splitter comprising:
 a first dielectric part having a respective first refractive index ($n_1$);
 a first color splitter part having a respective second refractive index ($n_2$), the first color splitter part being adjacent along a first side edge with the first dielectric part;
 a second color splitter part having a respective third refractive index ($n_3$), where $n_1<n_3<n_2$, the first and second color splitter parts being adjacent along a second side edge and having a common height H; and
 a second dielectric part having the first refractive index ($n_1$), the second dielectric part and the second color splitter part being adjacent along a third side edge;
 wherein $n_3<\sqrt{n_1 n_2}$ for a first plurality of the color splitters and $n_3>\sqrt{n_1 n_2}$ for a second plurality of the color splitters.

16. The optical component according to claim 15, wherein, for each of the color splitters, the first color splitter part has a respective first width ($W_1$), the second color splitter part has a respective second width ($W_2$), and a sum $W_1+W_2$ of the first and second width is greater than 390 nm.

17. The optical component according to claim 15, further comprising a plurality of image sensor pixels, wherein at least one of the color splitters at least partially covers two associated image sensor pixels.

* * * * *